(12) United States Patent
Suto et al.

(10) Patent No.: US 12,538,541 B2
(45) Date of Patent: Jan. 27, 2026

(54) SEMICONDUCTOR DEVICE, BIOSENSOR, BIOSENSOR ARRAY, AND LOGIC CIRCUIT

(71) Applicants: Ryota Suto, Kyoto (JP); Nobuto Hosono, Hyogo (JP)

(72) Inventors: Ryota Suto, Kyoto (JP); Nobuto Hosono, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 490 days.

(21) Appl. No.: 18/086,690

(22) Filed: Dec. 22, 2022

(65) Prior Publication Data
US 2023/0207633 A1    Jun. 29, 2023

(30) Foreign Application Priority Data

Dec. 27, 2021   (JP) .................................. 2021-213152

(51) Int. Cl.
    *H10D 62/80*   (2025.01)
    *G01N 27/414*  (2006.01)
    (Continued)

(52) U.S. Cl.
    CPC ....... *H10D 62/882* (2025.01); *G01N 27/4145* (2013.01); *G01N 27/4148* (2013.01);
    (Continued)

(58) Field of Classification Search
    CPC ............... H10D 62/882; H10D 62/258; H10D 62/8303; H10D 30/611; H10D 30/01;
    (Continued)

(56) References Cited

U.S. PATENT DOCUMENTS 11,348,998 B1*   5/2022  Hayashi .................... H01G 7/06
2014/0346515 A1* 11/2014  Yanagi ................. H10D 30/026
                                                              257/66
(Continued)

FOREIGN PATENT DOCUMENTS

CN      110663117 B    5/2021
JP      2006-526279 A  11/2006
(Continued)

OTHER PUBLICATIONS

Translation of KR 102338282 B1 (Year: 2014).*
(Continued)

*Primary Examiner* — Norman D Richards
*Assistant Examiner* — Sammantha K Salaz
(74) *Attorney, Agent, or Firm* — XSENSUS LLP

(57) ABSTRACT

A semiconductor device includes a first gate electrode, an insulating part, a source electrode, a drain electrode, and a contact part. The insulating part is on one surface of the first gate electrode. The source electrode is connected to the insulating part. The drain electrode is connected to the insulating part. The contact part is between the source electrode and the drain electrode and on the insulating part. The contact part contains an atomic layered material. The contact part has a second part contactable with a sample. The second surface is opposite to a first surface facing the insulating part. A surface of the insulating part, the surface facing the contact part, has an uneven structure with respect to the first gate electrode.

11 Claims, 19 Drawing Sheets

(51) Int. Cl.
*H03K 19/00* (2006.01)
*H10D 30/01* (2025.01)
*H10D 30/60* (2025.01)
*H10D 64/23* (2025.01)
*H10D 62/83* (2025.01)

(52) U.S. Cl.
CPC ....... H03K 19/0013 (2013.01); H10D 30/611 (2025.01); H10D 64/258 (2025.01); *H10D 30/01* (2025.01); *H10D 62/8303* (2025.01)

(58) Field of Classification Search
CPC ............. H10D 64/258; G01N 27/4145; G01N 27/4148; H03K 19/0013
See application file for complete search history.

(56) References Cited

U.S. PATENT DOCUMENTS

| | | | | |
|---|---|---|---|---|
| 2015/0369735 | A1* | 12/2015 | Avouris | ............ H01L 21/31144 438/49 |
| 2020/0196925 | A1* | 6/2020 | Lin | .................... A61B 5/14539 |
| 2023/0032228 | A1 | 2/2023 | Suto et al. | |

FOREIGN PATENT DOCUMENTS

| | | |
|---|---|---|
| JP | 2017-128461 A | 7/2017 |
| JP | 2018-014360 | 1/2018 |
| JP | 2018-048391 A | 3/2018 |
| JP | 2020031107 A | 2/2020 |
| JP | 2023-20889 A | 2/2023 |
| KR | 102338282 B1 * | 12/2021 ......... G01N 33/4975 |

OTHER PUBLICATIONS

K.I.Bolotin et al., Solid State Comm. 146,351 (2008).
S.Wagner et al./Microelectronic Engineering 159 (2016) 108-113.
L Ghazaryan et al.Nanotechnology 27 (2016) 255603.
Office Action issued Jul. 1, 2025 in Japanese Patent Application No. 2021-213152, 6 pages.
Office Action dated Nov. 18, 2025 in corresponding Japanese patent application No. 2021-213152 (6 pages; with English machine translation).

* cited by examiner (a)             (b)

SEMICONDUCTOR DEVICE, BIOSENSOR, BIOSENSOR ARRAY, AND LOGIC CIRCUIT

CROSS-REFERENCE TO RELATED APPLICATIONS

The present application claims priority under 35 U.S.C. § 119 to Japanese Patent Application No. 2021-213152, filed on Dec. 27, 2021. The contents of which are incorporated herein by reference in their entirety.

BACKGROUND OF THE INVENTION

1. Field of the Invention

The present invention relates to a semiconductor device, a biosensor, a biosensor array, and a logic circuit.

2. Description of the Related Art

Graphene field effect transistors (GFETs) using graphene (an example of an atomic layered material) as a channel (an example of a contact part) are expected to be applied to various uses because of the unique physical properties of graphene. In particular, application to highly sensitive sensors has attracted attention since graphene has an ultrahigh mobility of 100 times higher than that of silicon (Si) and has a large surface area ratio to a volume of a channel because of its two-dimensional shape. Graphene, which is composed only of carbon and is compatible with biomolecules, is expected very much to be applied particularly to biosensing of biomolecules.

However, the conventional GFETs, in which graphene serving as a channel is in contact with a base film (an example of an insulating part) on an entire surface and has a large contact area, are greatly affected by Coulomb scattering or the like of the base film. For example, when an entire surface under graphene has a hollow structure, an ultrahigh mobility of 200,000 $cm^2/Vs$ is exhibited, but when graphene is on a silicon thermal oxide film ($SiO_2$), which is typically used in a sensor or the like, the mobility is reduced to about 5,000 $cm^2/Vs$.

In this regard, a structure in which an entire surface under graphene has a hollow structure is known (see K. I. Bolotin et al., Solid State Comm. 146, 351(2008)). With this configuration, an ultrahigh mobility can be exhibited (see Non K. I. Bolotin et al., Solid State Comm. 146, 351(2008)), but the formation of a graphene film on the hollow structure may be torn because of damages in a transfer step, stresses applied to graphene, defects of graphene itself, and the like. Thus, the formation of a graphene film on the hollow structure has a very low yield rate.

A conventional technique is described in Japanese Unexamined Patent Application Publication No. 2018-014360.

The present invention has been made in view of the above problem, and an object of the present invention is to provide a semiconductor device capable of forming an atomic layered material with a high yield rate while reducing an influence from a base substrate to the atomic layered material, a biosensor, a biosensor array, and a logic circuit.

SUMMARY OF THE INVENTION

According to an aspect of the present invention, A semiconductor device includes a first gate electrode, an insulating part, a source electrode, a drain electrode, and a contact part. The insulating part is on one surface of the first gate electrode. The source electrode is connected to the insulating part. The drain electrode is connected to the insulating part. The contact part is between the source electrode and the drain electrode and on the insulating part. The contact part contains an atomic layered material. The contact part has a second part contactable with a sample. The second surface is opposite to a first surface facing the insulating part. A surface of the insulating part, the surface facing the contact part, has an uneven structure with respect to the first gate electrode.

BRIEF DESCRIPTION OF THE DRAWINGS

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1A:
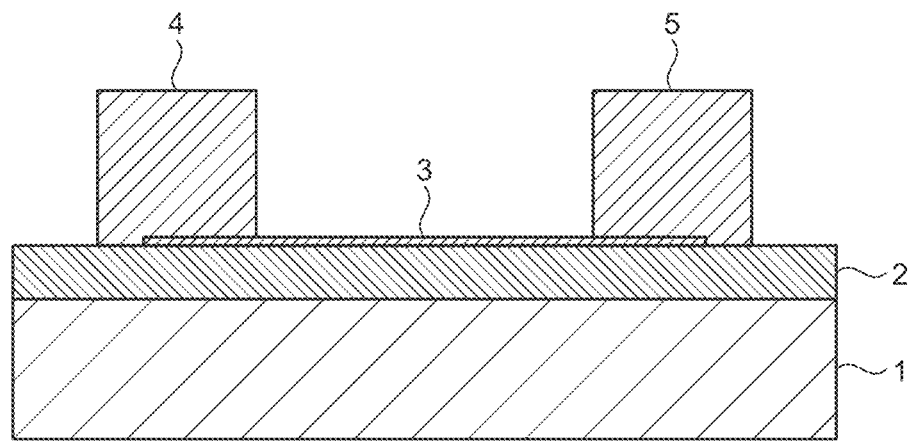
FIG. 1A is a diagram illustrating an example of a configuration of a conventional graphene transistor.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

Hereinafter, embodiments of a semiconductor device, a biosensor, a biosensor array, and a logic circuit will be described in detail with reference to the accompanying drawings.

An embodiment has an object to provide a semiconductor device a biosensor, a biosensor array, and a logic circuit in which an atomic layered material can be formed with a high yield rate while reducing an influence from a base substrate to the atomic layered material.

First Embodiment

Figure 1B:
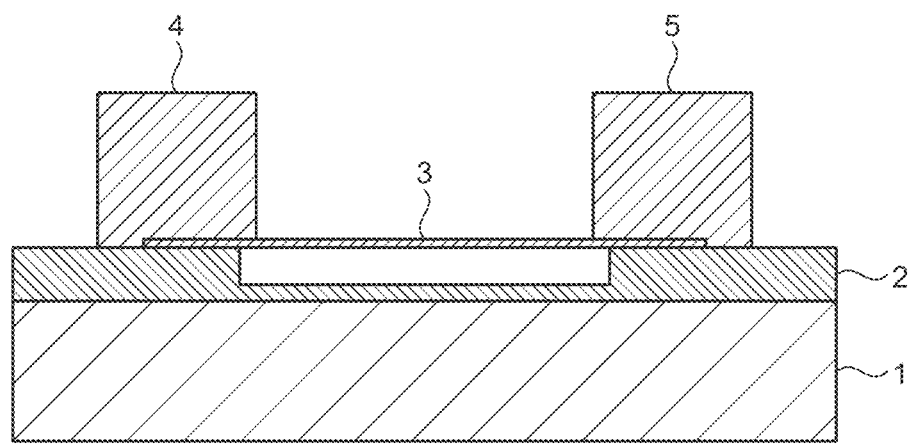
FIG. 1B is a diagram illustrating an example of a configuration of a conventional graphene transistor.

FIGS. 1A and 1B are diagrams each illustrating an example of a configuration of a conventional graphene transistor. A conventional graphene transistor includes a substrate 1, an insulating film 2, a channel 3, a source electrode 4, and a drain electrode 5. The substrate 1 may have conductivity, for example, it may be a silicon substrate doped at a high concentration.

The source electrode 4 and the drain electrode 5 induce carriers in the channel 3 to cause a source-drain current $I_{ds}$ to flow with an application of a voltage $V_{gs}$ to the substrate 1 in a state where a voltage $V_{ds}$ is applied. The graphene transistor can modulate the source-drain current $I_{ds}$ according to the value of the voltage $V_{gs}$, thereby operating as a transistor (back gate transistor).

As a performance index of the transistor, the field effect mobility $\mu_{FE}$ is used, and $\mu_{FE}$ is expressed by the following Formula (1).

$$\mu_{FE} = \frac{L \times g_m}{W \times C_{ox} \times V_{ds}} \quad (1)$$

Here, L represents a channel length, W represents a channel width, $V_{ds}$ represents a source-drain voltage, $g_m$ represents a transconductance represented by the following Formula (2), and $C_{OX}$ represents a gate capacitance represented by the following Formula (3).

$$g_m = \frac{\Delta I_d}{\Delta V_g} \quad (2)$$

$$C_{ox} = \frac{\varepsilon_0 \times \varepsilon}{d} \quad (3)$$

Here, $\varepsilon_0$ represents a dielectric constant in vacuum (8.85× $10^{-14}$ F/cm), $\varepsilon$ represents a relative dielectric constant of a gate insulating film, and d represents a film thickness of the gate insulating film.

It has been experimentally shown that graphene itself serving as a channel has a carrier mobility μ of more than 200,000 cm²/Vs at room temperature. However, the field effect mobility $\mu_{FE}$ calculated from the above Formula (1) when the graphene transistor is actually used as a field effect transistor is limited to about several tens of thousands cm²/Vs because of the influence of phonon scattering and Coulomb scattering of the base film under the graphene channel.

In fact, in K. I. Bolotin et al., Solid State Comm. 146, 351(2008) showing that graphene has a carrier mobility μ of more than 200,000 cm²/Vs at room temperature, the influence of the base film under the channel 3 is minimized by hollowing the entire space between the insulating film 2 and the channel 3 between the source electrode and the drain electrode as illustrated in FIG. 1B.

However, the process of producing the structure illustrated in FIG. 1B is very difficult, and S. Wagner et al./ Microelectronic Engineering 159 (2016) 108-113 shows that the yield rate is as low as 2.7% when single-layer graphene produced by a chemical vapor deposition (CVD) method by which graphene in a large area for industrial use can be produced is transferred onto a cavity structure. It is conceivable that the graphene film receives a stress and break because the base is hollow, leading to this low yield rate.

Figure 2A:
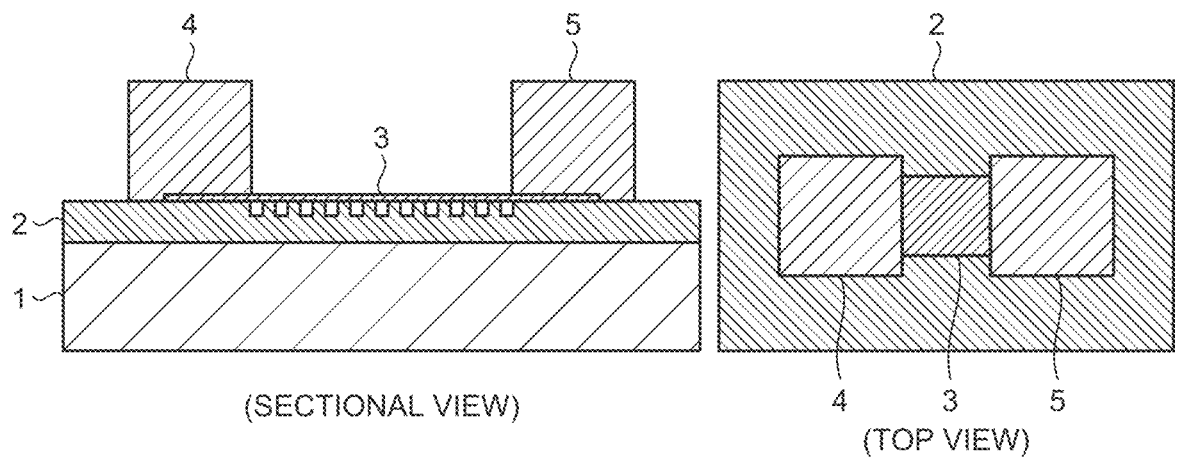
FIG. 2A includes a sectional view and a top view of an example of a graphene transistor to which a semiconductor device according to a first embodiment is applied.

FIG. 2A includes a sectional view and a top view of an example of a graphene transistor to which a semiconductor device according to a first embodiment is applied. The graphene transistor (an example of a semiconductor device) according to the present embodiment is a graphene transistor formed on an insulating film of a porous body. Specifically, the graphene transistor includes the substrate 1 (an example of a first gate electrode), an insulating film 2 of a porous body (an example of an insulating part), the channel 3, the source electrode 4 connected to the insulating film 2, and the drain electrode 5 connected to the insulating film 2.

The channel 3 is an example of a contact part provided between the source electrode 4 and the drain electrode 5 on the insulating film 2 and containing graphene (an example of an atomic layered material) that can contact a sample. The channel 3 has a surface (an example of a second surface) contactable with the sample, the surface being opposite to a surface (an example of a first surface) facing the insulating film 2. The sample can also contact the substrate 1.

The insulating film 2 is an example of an insulating part in which, for example, the surface facing the channel 3 includes a plurality of uneven structures as pores with respect to the substrate 1. For example, the insulating film 2 may be an insulating film in which the surface facing the channel 3 includes a plurality of uneven structures as pores, that is, the insulating film 2 may be an insulating film of a porous body. That is, in the insulating film 2, the surface facing the channel 3 includes a first surface provided at a position of a first distance with respect to the substrate 1, and a second surface provided at a position of a second distance different from the first distance. This causes the insulating film 2 and the channel 3 to be in contact with each other only at bumps of the insulating film 2 and not at dips of the insulating film 2. As a result, forming the channel 3 containing the atomic layered material on the insulating film 2 of a porous body can reduce the influence of the base film under the channel 3 (insulating film 2) and can form the atomic layered material with a high yield rate.

Figure 2B:
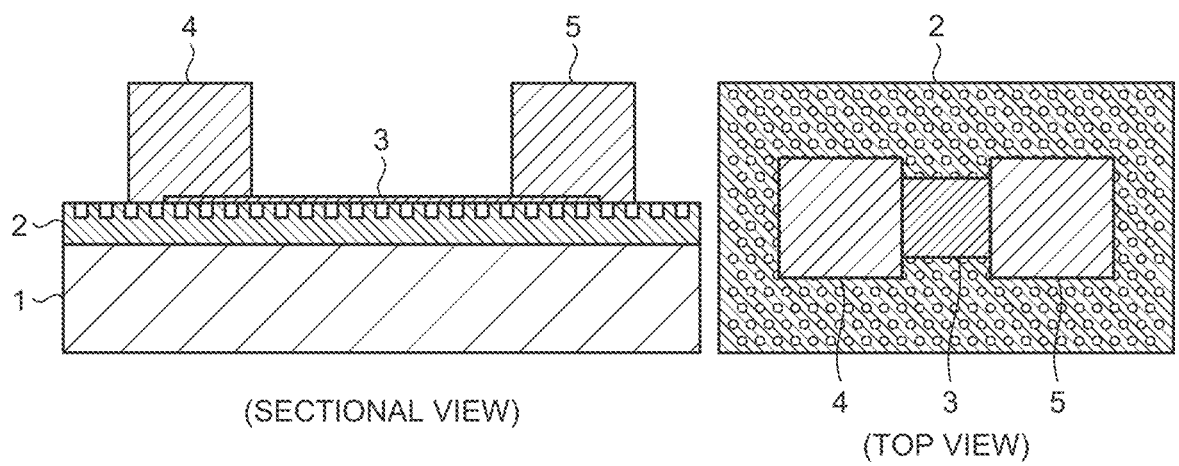
FIG. 2B includes a sectional view and a top view of a modification of a graphene transistor according to the first embodiment.
Figure 2C:
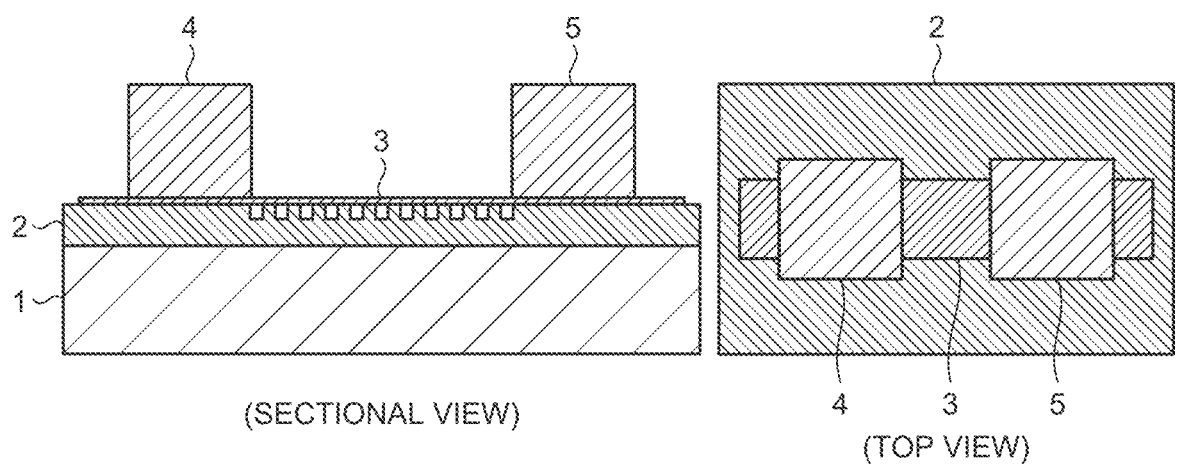
FIG. 2C includes a sectional view and a top view of a modification of the graphene transistor according to the first embodiment.
Figure 2D:
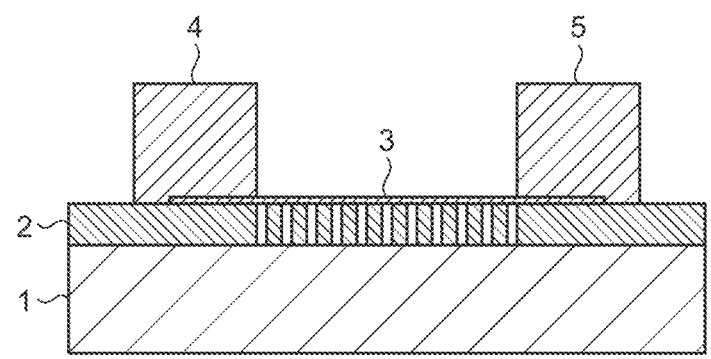
FIG. 2D is a sectional view of a modification of the graphene transistor according to the first embodiment.

FIGS. 2B to 2E each include a sectional view and a top view of a modification of the graphene transistor according to the first embodiment. The graphene transistor according to the present embodiment may include pores (that is, the uneven structures) formed on the entire surface of the insulating film 2 facing the channel 3 as illustrated in FIG. 2B. In the graphene transistor according to the present embodiment, graphene serving as the channel 3 may extend to the outside of the source electrode 4 and the drain electrode 5 as illustrated in FIG. 2C. In the graphene transistor according to the present embodiment, the pores of the insulating film 2 may penetrate to the substrate 1 as illustrated in FIG. 2D. The pores of the insulating film 2 may be pores extending with a curvature or may be communication pores in which a plurality of pores communicate with each other.

The graphene transistor illustrated in FIG. 2B, in which the entire surface of the insulating film 2 facing the channel 3 is a porous body, has an advantage that a process of limiting a region to be the porous body on the surface of the insulating film 2 facing the channel 3 is not required. Since the graphene included in the channel 3 only needs to be electrically conducted between the source electrode 4 and the drain electrode 5, the channel 3 only needs to be in contact with at least the source electrode 4 and the drain electrode 5. That is, as illustrated in FIG. 2C, the channel 3 may extend to the outside of the source electrode 4 and the drain electrode 5 as long as the channel 3 is not in contact with electrodes other than the source electrode 4 and the drain electrode 5. In addition, the graphene transistor illustrated in FIG. 2D, including a portion where the insulating film 2 is not present at all under the channel 3 containing graphene, can greatly reduce the influence of Coulomb scattering on the insulating film 2.

The insulating film 2 of a porous body (insulating film 2 having a plurality of uneven structures as pores) and the channel 3 are in contact only at bumps of the insulating film 2 and are not in contact at dips of the insulating film 2. However, forming the channel 3 including graphene by general wet transfer to form this structure raises concerns, for example, a solution such as water remains in the porous body, and the graphene follows the porous body (the insulating film 2 and the graphene contact each other at dips too). Thus, it is preferable to form the channel 3 including graphene by dry transfer such as roll to roll processing (R2R) or stamping via resin such as PDMS.

Figure 2E:
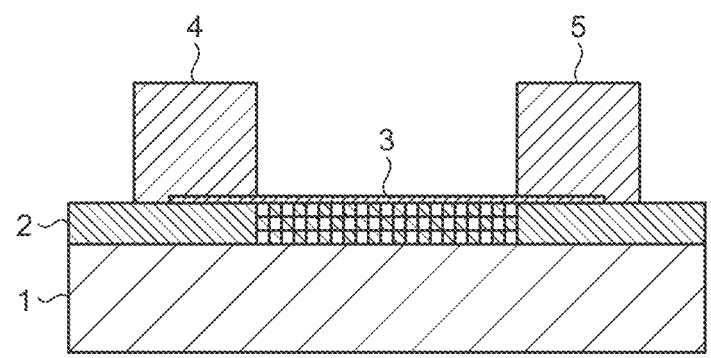
FIG. 2E is a sectional view of a modification of the graphene transistor according to the first embodiment.

The pore diameter of the porous body of the insulating film 2 is, depending on the method for producing the porous body, about several nm to 100 nm, which is smaller than the length of the channel 3. The depth of the pores of the porous body of the insulating film 2 may be about the pore diameter, or the pores may penetrate through the insulating film 2. The penetration here may be a penetration from the surface of the insulating film 2 on the channel 3 side in the direction perpendicular to the substrate 1 as illustrated in FIG. 2D or may be a penetration from the surface of the insulating film 2 on the channel 3 side in a direction different from the direction perpendicular to the substrate 1 as illustrated in FIG. 2E. Forming such a structure in the insulating film 2 can reduce the contact area between the channel 3 and the base film (insulating film 2) as compared with the conventional graphene transistor illustrated in FIG. 1A and thus can reduce the influence of the base film to graphene. In addition, since the stress applied to graphene is smaller than that of the conventional graphene transistor illustrated in FIG. 1B, improvement in the yield rate of the graphene transistor can be expected.

In the present embodiment, the substrate 1 is a silicon (Si) substrate. The substrate 1 is not limited to silicon and it may be another conductor. The insulating film 2 having an uneven surface (uneven structures) is a silicon oxide ($SiO_x$) film. The uneven surface may be formed, for example, by alternately stacking and forming an $Al_2O_3$ film and a $SiO_x$ film by an atomic layer deposition (ALD) method capable of controlling atomic layers in units of one-layer, and then etching the stack with a phosphoric acid-based solution in which only the $Al_2O_3$ film is dissolved, as shown in L Ghazaryan et al. Nanotechnology 27 (2016) 255603. The film thickness of the insulating film 2 is determined by the total number of cycles of the $Al_2O_3$ film and the $SiO_x$ film to be stacked. However, when each stacked film is sufficiently thick, the uneven structures are not formed after solution etching. Thus, each stacked film is desirably 10 cycles or less. When the total film thickness of the insulating film 2 is thin, the uneven structures are not sufficiently formed. Thus, the thickness of the uneven structures is desirably 100 nm or more. Forming the uneven structures in the insulating film 2 by this method can uniformly form the uneven structures each having a pore diameter of several nm to several tens nm.

The pore diameter of each uneven structure of the insulating film 2 can be changed by the ratio (film thickness) between the $Al_2O_3$ film and the $SiO_x$ film of the stacked film. Thus, the ratio of each stacked film is desirably optimized in 1 to 10 cycles. For example, the ratio between the $Al_2O_3$ film and the $SiO_x$ film may be 1 cycle:1 cycle or 2 cycles:5 cycles.

Although an example in which the insulating film 2 is $SiO_x$ has been described here, the insulating film 2 can be formed by appropriately selecting a film to be stacked and an etchant as long as it is an oxide film that can be formed by the ALD method, such as aluminum oxide ($AlO_x$), hafnium oxide ($HfO_x$), titanium oxide ($TiO_x$), tantalum oxide ($TaO_x$), zirconium oxide ($ZrO_x$), and yttrium oxide ($YO_x$). When the insulating film 2 is formed as the insulating part of the transistor, the insulating film 2 is preferably aluminum oxide ($AlO_x$), hafnium oxide ($HfO_x$), or the like having a high dielectric constant. As a method for forming the insulating film 2 having the uneven structures, an anodic oxidation method or the like can be used in addition to the ALD method to form the uneven structures.

The channel 3 may be graphene or may be an atomic layered material similar to graphene. For example, transition metal dichalcogenides (TMDCs) typified by molybdenum disulfide ($MoS_2$), tungsten diselenide ($WSe_2$), and the like, black phosphorus, silicene, and germanene are expected to have a large influence from the base film because they are in atomic layered forms, and thus the same effect as graphene can be expected.

The source electrode 4 and the drain electrode 5 are, for example, Au, Cr/Au, Ti/Au, Ni/Au, Pd/Au, Cr/Ni/Au, Ti/Ni/Au, Cr/Pd/Au, or Ti/Pd/Au. Cr and Ti function as an adhesion layer with the substrate 1. For example, when the channel 3 is graphene, Ni and Pd function as a layer for reducing contact resistance.

In this manner, according to the graphene transistor of the first embodiment, the porous insulating film 2 and the channel 3 are in contact only at bumps of the insulating film 2 and are not in contact at dips of the insulating film 2. As a result, forming the channel 3 containing the atomic layered material on the insulating film 2 of a porous body can reduce the influence of the base film under the atomic layered material (insulating film 2) and can form the atomic layered material with a high yield rate.

Second Embodiment

The present embodiment is an example in which the graphene transistor includes an insulating film that covers the opposite surface of the channel from the substrate. In the following description, description of the same configurations as the first embodiment will be omitted.

Figure 3A:
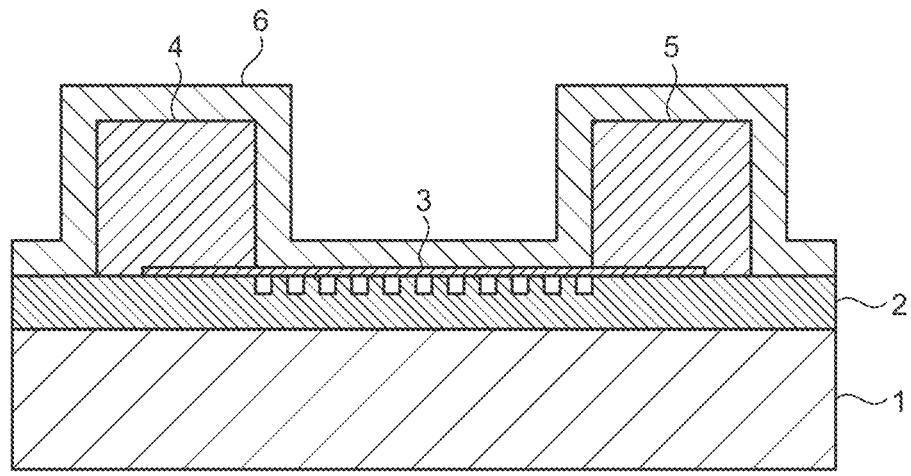
FIG. 3A is a sectional view of an example of a graphene transistor according to a second embodiment.

FIG. 3A is a sectional view of an example of a graphene transistor according to a second embodiment. In the graphene transistor according to the present embodiment, surfaces of the porous insulating film 2, the channel 3, the source electrode 4, and the drain electrode 5, the surfaces being opposite from the substrate 1, are covered with an insulating film 6 (an example of a first insulating film) as illustrated in FIG. 3A.

The insulating film 6 functions as a passivation film. For example, aluminum oxide ($Al_2O_3$) formed by an atomic layer deposition (ALD) method, silicon oxide ($SiO_x$), a parylene film which is an organic film excellent in moisture resistance, silicon nitride (SiN) formed by a chemical vapor deposition (CVD) method, a coating type insulating film, or a stacked film thereof may be applied as the insulating film 6. As illustrated in FIG. 3A, since the channel 3 is covered with the insulating film 6, it is possible to reduce unintended doping due to the measurement environment, for example, the influence of moisture and oxygen in the atmosphere.

Figure 3B:
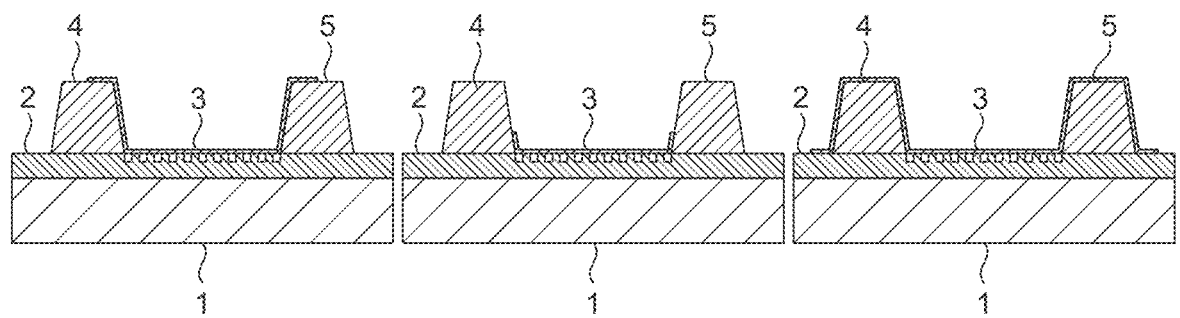
FIG. 3B is a sectional view of a modification of the graphene transistor according to the second embodiment.

FIG. 3B is a sectional view of a modification of the graphene transistor according to the second embodiment. As illustrated in FIG. 3B, the channel 3 may be disposed on the source electrode 4 and the drain electrode 5. The channel 3 only needs to be in contact with the source electrode 4 and the drain electrode 5 to achieve electrical conduction between the source electrode 4 and the drain electrode 5. That is, the channel 3 may entirely cover the source electrode 4 and the drain electrode 5 or may extend to the outside of the source electrode 4 and the drain electrode 5 as long as the channel 3 is not in contact with other electrodes.

Note that, in the graphene transistor illustrated in FIG. 3B, since the channel 3 is disposed on the source electrode 4 and the drain electrode 5, the channel 3 may receive a stress because of the step between the source electrode 4 and the drain electrode 5. Thus, the source electrode 4 and the drain electrode 5 desirably have a tapered shape (for example, a forward tapered shape) as illustrated in FIG. 3B.

In the graphene transistor illustrated in FIG. 3B, graphene of the channel 3 is formed after the source electrode 4 and the drain electrode 5 are formed in the production process. Thus, it is possible to reduce damages to the channel 3, unintended doping, and the like during the formation process of the source electrode 4 and the drain electrode 5. Specifically, it is possible to avoid problems such as peeling of the channel 3 from the insulating film 2 of a porous body, or chemical doping caused by contact between the channel 3 and a photoresist or a peeling solution used for lift-off process or the like.

Figure 3C:
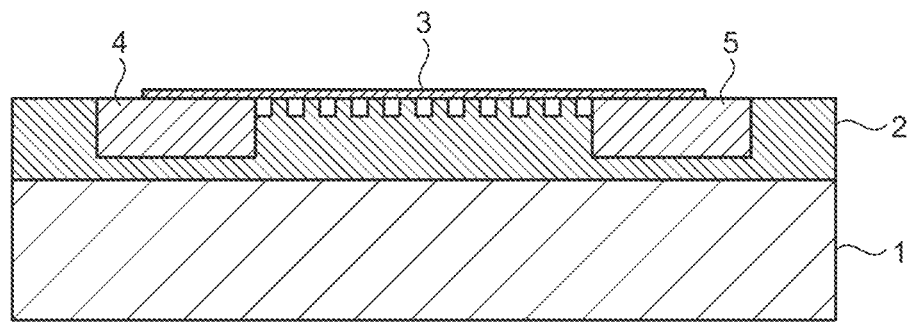
FIG. 3C is a sectional view of a modification of the graphene transistor according to the second embodiment.

FIG. 3C is a sectional view of a modification of the graphene transistor according to the second embodiment. As illustrated in FIG. 3C, the source electrode 4 and the drain electrode 5 may be embedded in the insulating film 2 of a porous body. The channel 3 only needs to be in contact with the source electrode 4 and the drain electrode 5 to achieve electrical conduction between the source electrode 4 and the drain electrode 5. That is, the channel 3 may entirely cover the source electrode 4 and the drain electrode 5. The channel 3 may extend to the outside of the source electrode 4 and the drain electrode 5 as long as the channel 3 is not in contact with other electrodes.

In the graphene transistor illustrated in FIG. 3C, the channel 3 can be formed flat, and graphene of the channel 3 is formed after the source electrode 4 and the drain electrode 5 are formed in the production process. Thus, it is possible to reduce stresses to the channel 3, damages to the channel 3, unintended doping, and the like during the formation process of the source electrode 4 and the drain electrode 5. Specifically, it is possible to avoid problems such as peeling of the channel 3 from the insulating film 2 of a porous body, or chemical doping caused by contact between the channel 3 and a photoresist or a peeling solution used for lift-off process or the like.

In the insulating film 2 illustrated in FIGS. 3A to 3C, the uneven structures may be formed on the entire surface of the substrate 1, or pores of the uneven structures may penetrate to the substrate 1, as long as there is a porous body under the region of the channel 3 between the source electrode 4 and the drain electrode 5, as in the graphene transistors illustrated in FIGS. 2A to 2E.

In this manner, according to the graphene transistor according to the second embodiment, it is possible to reduce unintended doping due to the measurement environment, for example, the influence of moisture and oxygen in the atmosphere, stresses applied to the channel 3, damages to the channel 3 during the formation process of the source electrode 4 and the drain electrode 5, and the like by introducing the insulating film 6 or devising the arrangement of the source electrode 4, the drain electrode 5, and the channel 3.

Third Embodiment

The present embodiment is an example in which the graphene transistor has an insulating film between the substrate and the gate electrode. In the following description, description of the same configurations as the embodiments described above will be omitted.

Figure 4A:
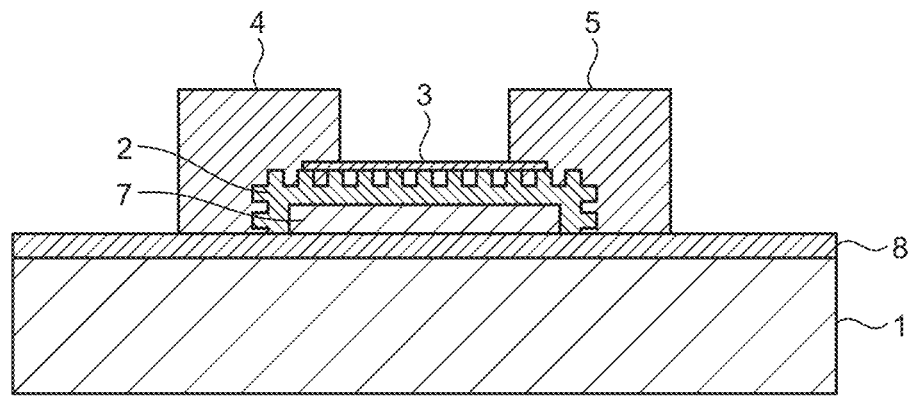
FIG. 4A is a sectional view of an example of a graphene transistor according to a third embodiment.

FIG. 4A is a sectional view of an example of a graphene transistor according to a third embodiment. The graphene transistor according to the present embodiment is a graphene transistor on an insulating film including the substrate 1 (an example of a substrate), a gate electrode 7 (an example of a first gate electrode), an insulating film 8 (an example of a second insulating film) provided between the substrate 1 and the gate electrode 7, the insulating film 2, the channel 3, the source electrode 4, and the drain electrode 5. The insulating film 2 and the channel 3 are in contact only at bumps of the insulating film 2 and are not in contact at dips of the insulating film 2.

The substrate 1 and the insulating film 8 may be integrated as a substrate having an insulating property, and may be, for example, a substrate having flexibility such as polyimide, PEN, or PET. When the graphene transistor is formed on the substrate 1 having flexibility, a sensor or the like to which the graphene transistor is applied can be formed on a curved surface, and for example, a sensor or the like to attach to a human body can be realized, which is very useful for sensing vital data. By forming the graphene transistor on the substrate 1 having flexibility, the sensor and the body can closely contact each other, so the heart rate and the myoelectric potential can be detected in real time with accuracy, and sensing of body odor or body fluids such as sweat and tears can possibly be performed in real time. Health condition, mood, and the like can possibly be known from these data.

In addition, the graphene transistor illustrated in FIG. 4A, in which the gate electrode 7 is disposed on the surface of the substrate 1, can be integrated and mounted easily. Further, the graphene transistor has advantages when a plurality of graphene transistors are arrayed. For example, it is possible to apply individual gate voltages to individual elements (graphene transistors), and it is possible to control a reference voltage (Dirac voltage) for each element.

Figure 4B:
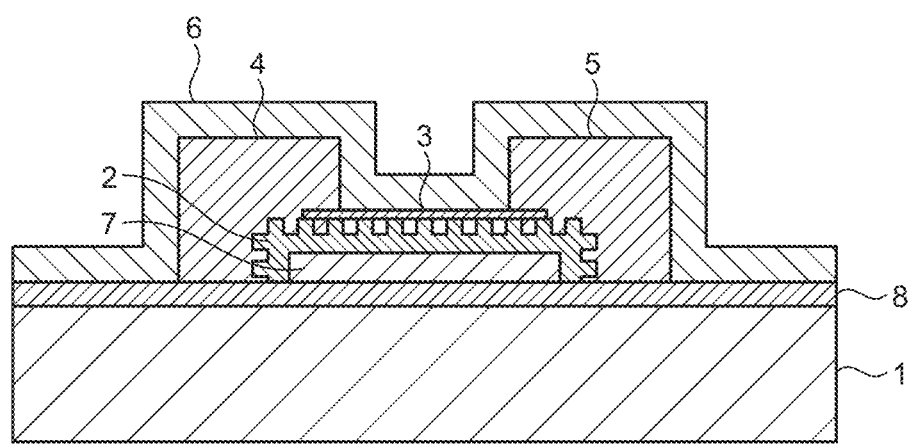
FIG. 4B is a sectional view of another example of the graphene transistor according to the third embodiment.

FIG. 4B is a sectional view of another example of the graphene transistor according to the third embodiment. In the graphene transistor according to the embodiment, the channel 3, the source electrode 4, the drain electrode 5, and the insulating film 8 may be covered with the insulating film 6 as illustrated in FIG. 4B. This causes the graphene transistor according to the present embodiment to have the same function as the graphene transistor illustrated in FIG. 4A and the channel 3 to be covered with the insulating film 6. Thus, it is possible to reduce unintended doping due to the measurement environment, for example, the influence of moisture and oxygen in the atmosphere.

Figure 4C:
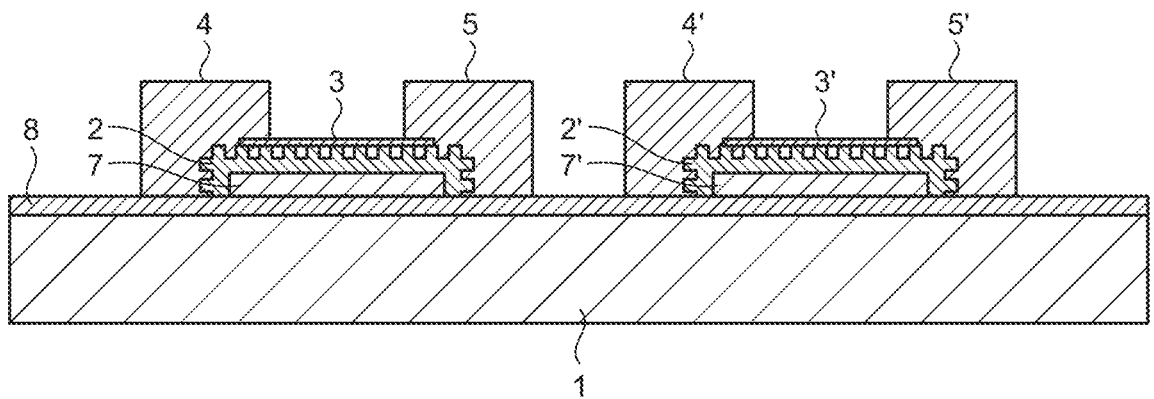
FIG. 4C is a sectional view of an example of a transistor array including two graphene transistors according to the third embodiment.
Figure 4D:
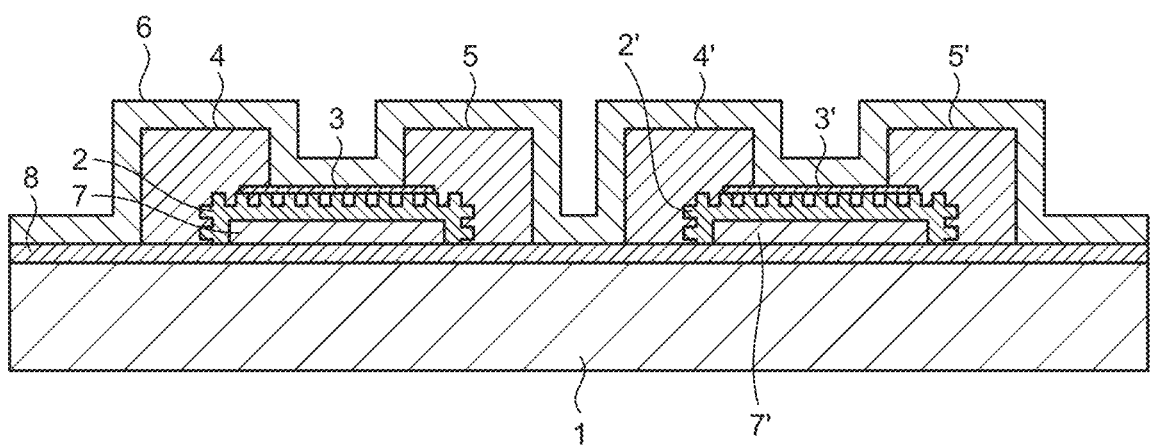
FIG. 4D is a sectional view of another example of the transistor array including two graphene transistors according to the third embodiment.

FIG. 4C is a sectional view of an example of a transistor array including two graphene transistors according to the third embodiment. FIG. 4D is a sectional view of another example of the transistor array including two graphene transistors according to the third embodiment. According to the graphene transistor arrays illustrated in FIGS. 4C and 4D, it is possible to apply different gate voltages to the gate electrode 7 and a gate electrode 7', it is possible to induce any carriers individually in the channel 3 and a channel 3', and it is possible to control the reference voltage (Dirac voltage) of the individual graphene transistors. Since the reference voltage (Dirac voltage) of each graphene transistor can be controlled, variations in characteristics between the sensors of the graphene transistor array can be reduced and controlled, and properties of each transistor can be measured with accuracy.

Figure 4E:
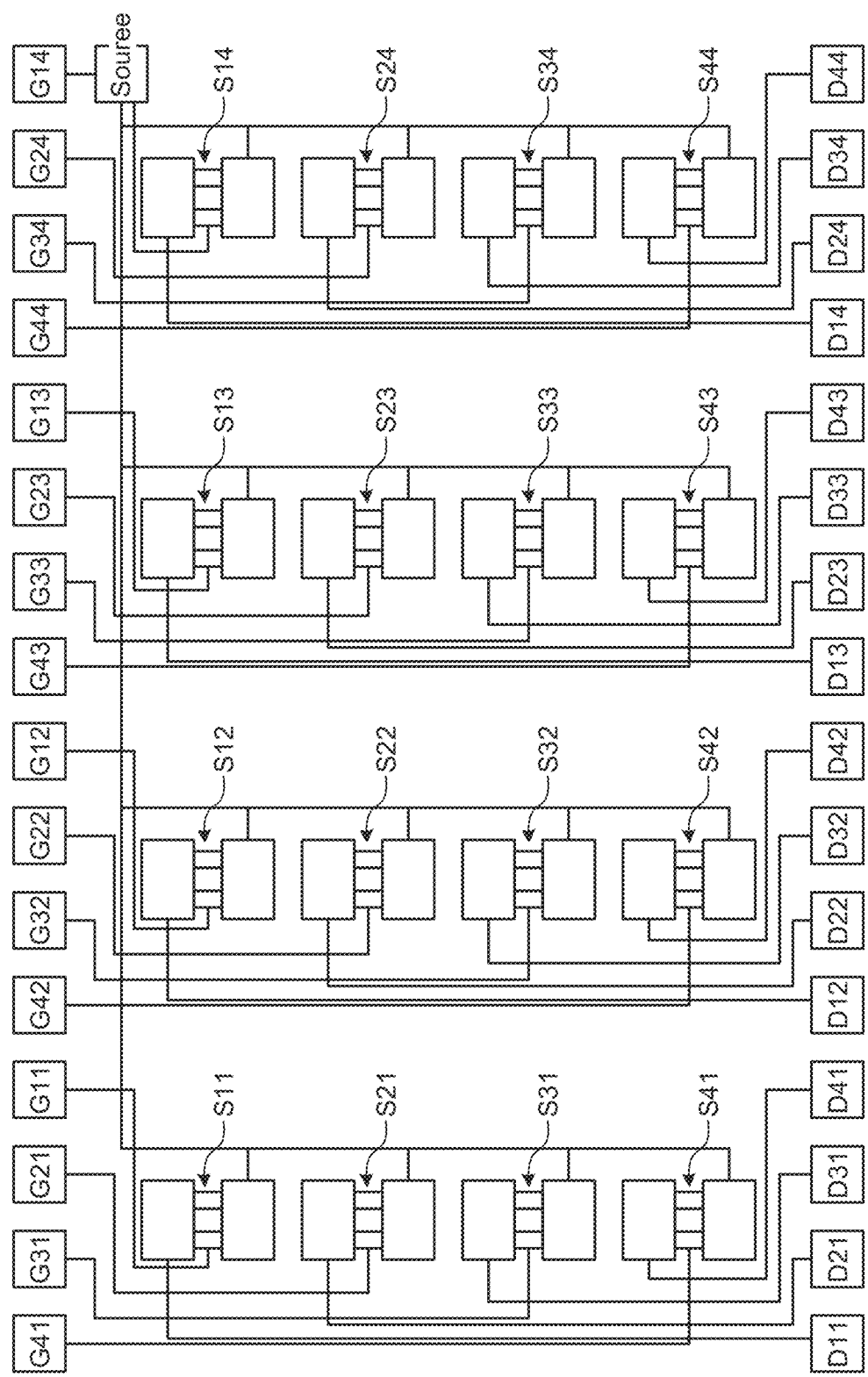
FIG. 4E is a diagram illustrating an example of a 4×4 array of graphene transistors according to the third embodiment.

FIG. 4E is a diagram illustrating an example of a 4×4 array of graphene transistors according to the third embodiment. In the present embodiment, a 4×4 array (an example of a logic circuit) is a transistor array in which graphene transistors S11 to S44 are arranged as illustrated in FIG. 4E. Each of the graphene transistors S11 to S44 has the structure as the graphene transistor array illustrated in FIG. 4B, for example.

The source electrode 4 is common to all sensors (graphene transistors) and has a configuration in which a gate voltage and a drain voltage can be applied to each graphene transistor. For example, the gate voltage of the transistor S11 is a gate voltage G11, and the drain voltage is applied from a drain voltage D11. The insulating film 2 illustrated in FIGS. 4A to 4E may be formed on the entire surface of the substrate 1, or pores of the uneven structures may penetrate to the gate electrode 7, as long as a porous body lies under the region of the channel 3 between the source electrode 4 and the drain electrode 5, as in FIG. 2A.

In this manner, the graphene transistor according to the third embodiment, in which the gate electrode 7 is disposed on the surface of the substrate 1, can be integrated and mounted easily. Further, the graphene transistor has advantages when a plurality of graphene transistors are arrayed. For example, it is possible to apply individual gate voltages to individual elements (graphene transistors), and it is possible to control a reference voltage (Dirac voltage) for each element.

Fourth Embodiment

The present embodiment is an example in which the graphene transistor includes an insulating film provided between a top-gate electrode and the opposite surface of the channel from an insulating film. In the following description, description of the same configurations as the embodiments described above will be omitted.

Figure 5A:
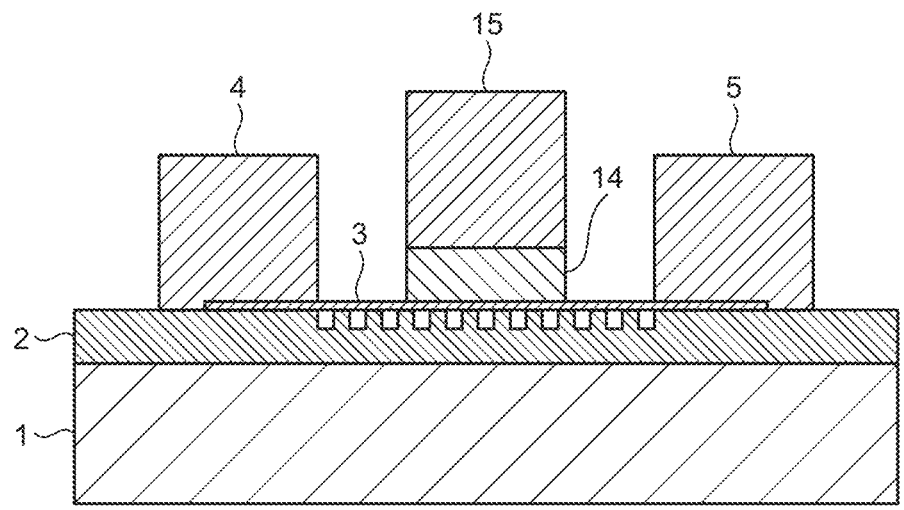
FIG. 5A is a sectional view of an example of a graphene transistor according to a fourth embodiment.

FIG. 5A is a sectional view of an example of a graphene transistor according to a fourth embodiment. Specifically, the graphene transistor is a top-gate graphene transistor on an insulating film, including the substrate 1, the insulating film 2 of a porous body, the channel 3, the source electrode 4, the drain electrode 5, a gate insulating film 14, and a top-gate electrode 15 (an example of a second gate electrode) as illustrated in FIG. 5A. The insulating film 2 of a porous body and the channel 3 are in contact only at bumps of the insulating film 2 and are not in contact at dips of the insulating film 2.

The gate insulating film 14 (an example of a third insulating film) is an insulating film provided between the top-gate electrode 15 and the opposite surface of the channel 3 from the insulating film 2. For the gate insulating film 14, silicon oxide ($SiO_2$), aluminum oxide ($Al_2O_3$), hafnium oxide ($HfO_2$), a stacked film thereof, or the like formed by an ALD method or a CVD method may be applied. To improve the characteristics of the graphene transistor, it is preferable that the gate insulating film 14 have a small film thickness and be made of a material having a high dielectric constant.

The graphene transistor according to the present embodiment, in which the top-gate electrode 15 is disposed on the surface of the substrate 1 as illustrated in FIG. 5A, can be integrated and mounted easily. The graphene transistor also has advantages when the substrate 1 is a highly doped silicon substrate. For example, it can be used as a dual-gate transistor of the top-gate electrode 15 and the substrate 1.

Figure 5B:
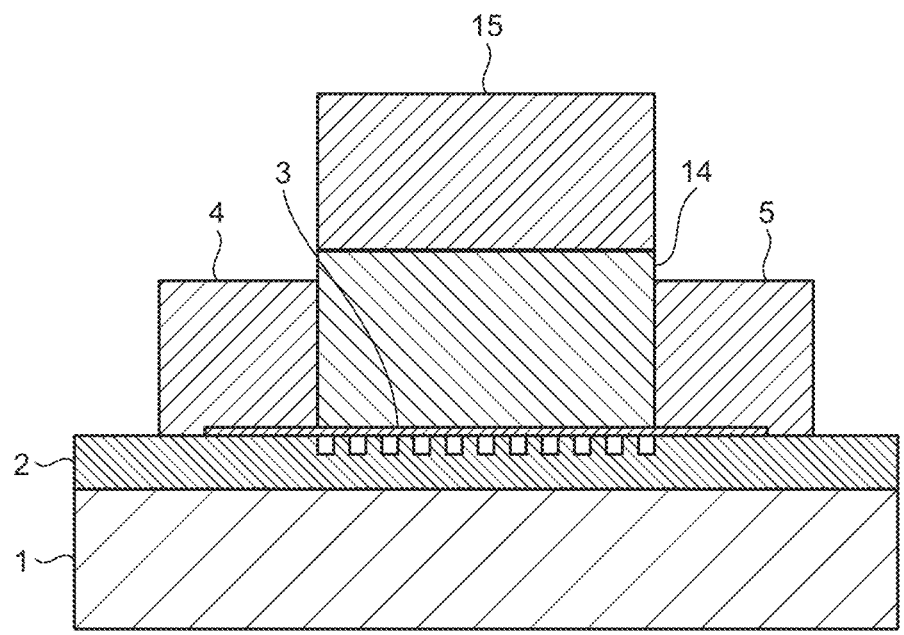
FIG. 5B is a sectional view of another example of the graphene transistor according to the fourth embodiment.

FIG. 5B is a sectional view of another example of the graphene transistor according to the fourth embodiment. In the graphene transistor according to the present embodiment, the entire channel 3 may be covered with the gate insulating film 14 as illustrated in FIG. 5B. Note that, in the graphene transistor illustrated in FIG. 5B, the film thickness of the gate insulating film 14 needs to be larger than the film thicknesses of the source electrode 4 and the drain electrode 5 to prevent an electrical short circuit between the source electrode 4 and the top-gate electrode 15 or between the drain electrode 5 and the top-gate electrode 15. In this case, since the entire channel 3 is covered with the gate insulating film 14, it is possible to reduce unintended doping due to the measurement environment, for example, the influence of moisture and oxygen in the atmosphere.

Further, since there is no horizontal distance, which is called an access region, between the source electrode 4 and the gate insulating film 14 or between the drain electrode 5 and the gate insulating film 14, the gate voltage is applied to the entire region of the channel 3, contributing to improvement of the characteristics of the graphene transistor. The graphene transistor illustrated in FIG. 5B has advantages when the substrate 1 is a highly doped silicon substrate, similarly to the graphene transistor illustrated in FIG. 5A. For example, it can be used as a dual-gate transistor of the top-gate electrode 15 and the substrate 1.

Figure 5C:
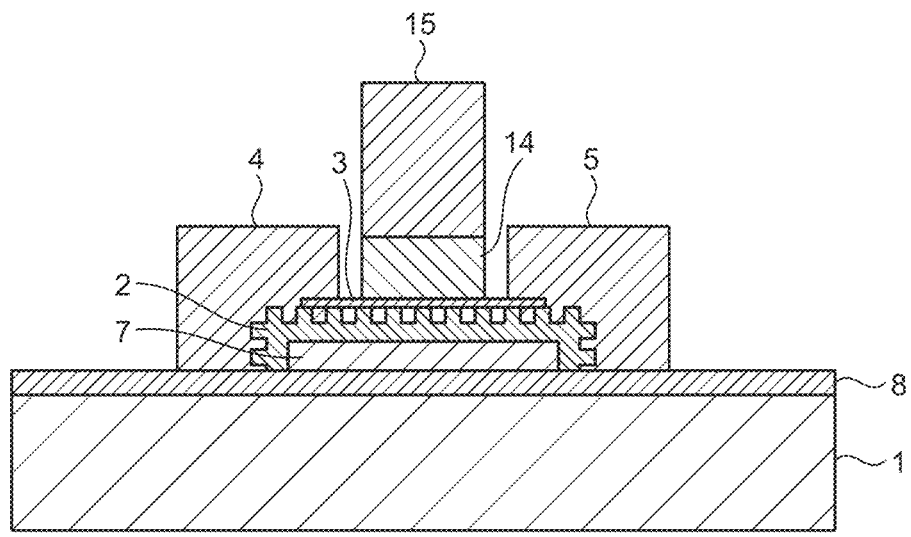
FIG. 5C is a sectional view of another example of the graphene transistor according to the fourth embodiment.

FIG. 5C is a sectional view of another example of the graphene transistor according to the fourth embodiment. The graphene transistor according to the present embodiment may be a dual-gate graphene transistor including the substrate 1, the insulating film 8, the gate electrode 7, the insulating film 2 of a porous body, the channel 3, the source electrode 4, the drain electrode 5, the gate insulating film 14, and the top-gate electrode 15 as illustrated in FIG. 5C. The insulating film 2 of a porous body and the channel 3 are in contact only at bumps of the insulating film 2 and are not in contact at dips of the insulating film 2.

The graphene transistor illustrated in FIG. 5C, in which a bottom-gate electrode (the substrate 1 in the graphene transistors illustrated in FIGS. 5A and 5B and the gate electrode 7 in the graphene transistor illustrated in FIG. 5C) is disposed on the surface of the substrate 1, can be integrated and mounted easily as compared with the graphene gate transistors illustrated in FIGS. 5A and 5B. Further, the graphene transistor has advantages when a plurality of graphene transistors are arrayed. For example, it is possible to apply individual gate voltages to individual elements.

Figure 5D:
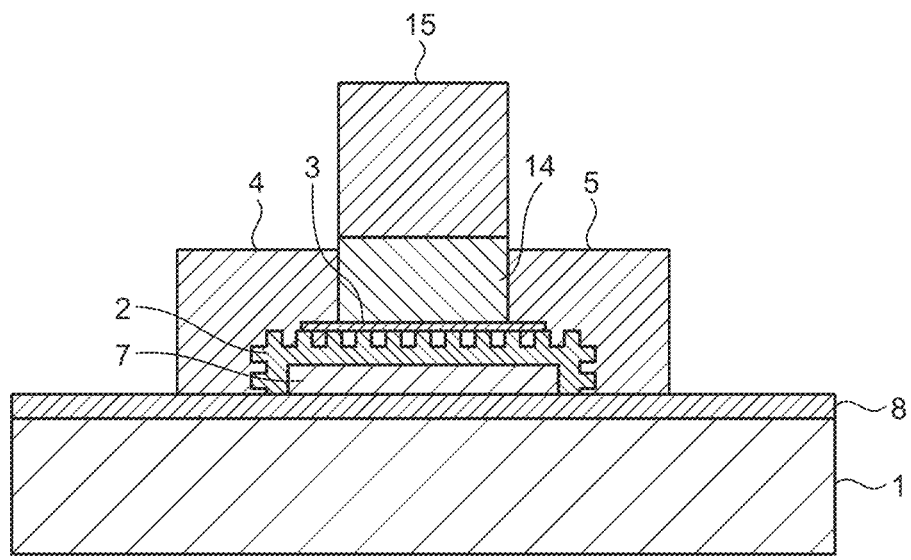
FIG. 5D is a sectional view of another example of the graphene transistor according to the fourth embodiment.

FIG. 5D is a sectional view of another example of the graphene transistor according to the fourth embodiment. The graphene transistor according to the present embodiment, in which the entire channel 3 may be covered with the gate insulating film 14 as illustrated in FIG. 5D, has the same function as the graphene transistor illustrated in FIG. 5C. The entire channel 3 is covered with the gate insulating film 14 in the graphene transistor illustrated in FIG. 5D, which can reduce unintended doping due to the measurement environment, for example, the influence of moisture and oxygen in the atmosphere. Further, since there is no access region which is a distance in the horizontal direction between the source electrode 4 and the gate insulating film 14 or between the drain electrode 5 and the gate insulating film 14, the gate voltage is applied to the entire region of the channel 3, which can contribute to improvement of the characteristics of the graphene transistor.

Figure 5E:
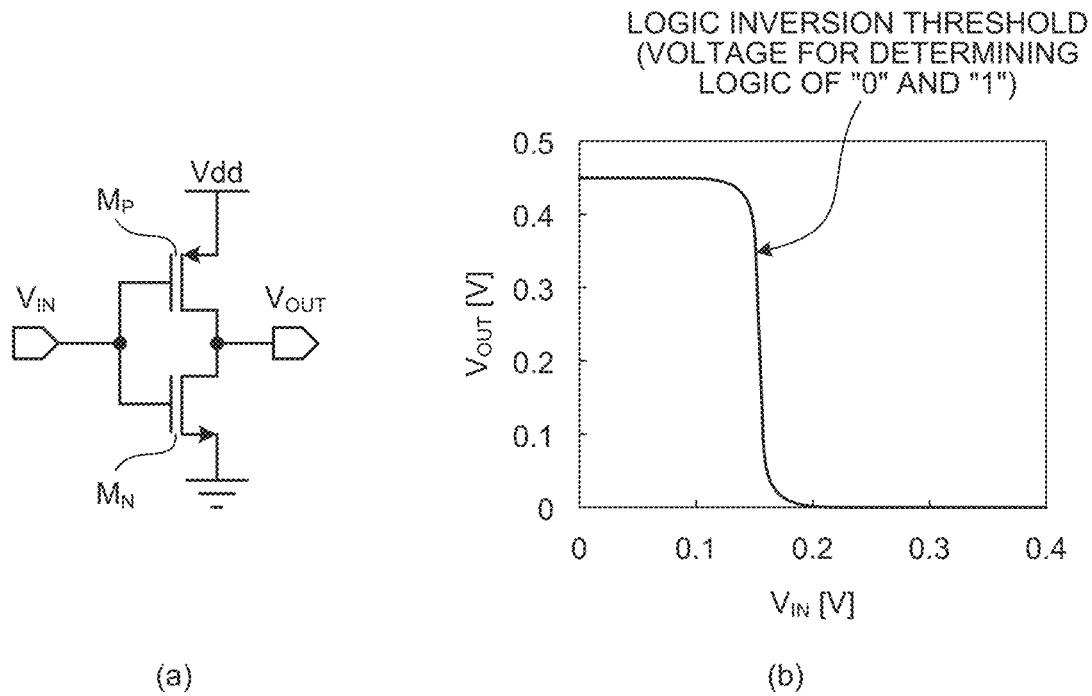
FIG. 5E is a circuit diagram of an example of a low-voltage CMOS inverter circuit (logic inversion circuit) in which graphene transistors according to the fourth embodiment are arrayed.
Figure 5F:
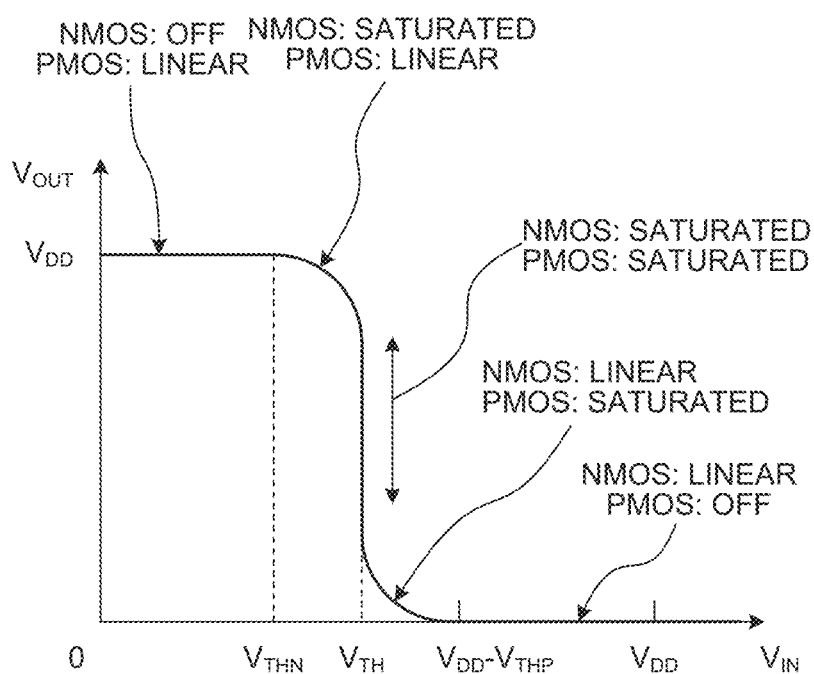
FIG. 5F is a diagram illustrating an example of input-output characteristics of the low-voltage CMOS inverter circuit in which the graphene transistors according to the fourth embodiment are arrayed.

FIG. 5E is a circuit diagram of an example of a low-voltage CMOS inverter circuit (logic inversion circuit) in which graphene transistors according to the fourth embodiment are arrayed. FIG. 5F is a diagram illustrating an example of input-output characteristics of the low-voltage CMOS inverter circuit in which graphene transistors according to the fourth embodiment are arrayed. In FIG. 5F, the vertical axis represents the voltage applied to an output signal line Vout, and the horizontal axis represents the voltage applied to an input signal line Vin.

The structure of the graphene transistors illustrated in FIGS. 5A to 5D can constitute various electric circuits by being arrayed. In the low-voltage CMOS inverter circuit illustrated at (a) in FIG. 5E, Vdd and Vss are potentials of power supply lines. For example, Vdd has a potential difference of about 0.5 to 1.0 V with respect to Vss. Vin is an input signal line, and Vout is an output signal line. The graphene transistor on the Vdd side is a p-channel metal oxide semiconductor field effect transistor (pMOSFET) Mp, and the graphene transistor on the Vss side is an re-channel metal oxide semiconductor field effect transistor (nMOSFET) Mn.

When the input signal line Vin has the same potential as Vss, the pMOSFET Mp is turned on and the nMOSFET Mn is turned off. At this time, the potential of the output signal line Vout becomes substantially equal to Vdd. When the input signal line Vin has the same potential as Vdd, the pMOSFET Mp is turned off, and the nMOSFET Mn is turned on. Thus, the potential of the output signal line Vout is substantially equal to Vss. In this manner, a potential opposite to the input signal line Vin appears in the output signal line Vout.

As illustrated at (b) in FIG. 5E, Vdd of a power supply line is 450 mV. In this example, when the potential of the input signal line Vin exceeds 0.15 V, the potential of the output signal line Vout changes from 0.45 V of Vdd to 0 V. That is, the input potential for determining the logic of "0" and "1" (the input potential of a logic inversion threshold) is 0.15 V. Then, as shown in the input-output characteristics of the low-voltage CMOS inverter circuit (see FIG. 5F), the logic inversion threshold potential of the pMOSFET and the logic inversion threshold potential of the nMOSFET are assumed.

An example of the low-voltage CMOS inverter circuit has been described here, but the present invention is also applicable to other circuits, for example, a high-frequency circuit utilizing the ultrahigh mobility of graphene such as a low noise amplifier (LNA).

In the insulating film 2 of the graphene transistors illustrated in FIGS. 5A to 5D, the entire surface of the substrate 1 may be a porous body, and the pores of the insulating film 2 may penetrate to the substrate 1 or the gate electrode 7 as long as there is a porous body under the region of the channel 3 between the source electrode 4 and the drain electrode 5 as in FIG. 2A. In the graphene transistors illustrated in FIGS. 5C and 5D, the substrate 1 and the insulating film 8 may be integrated as a substrate having an insulating property, and may be, for example, a substrate having flexibility such as polyimide, PEN, or PET. A sensor or the like to which the graphene transistor is applied can be formed on a curved surface by forming the graphene transistor on the substrate 1 having flexibility, and for example, a sensor or the like to attach to a human body can be realized, which is very useful for sensing vital data. The sensor and the body can closely contact each other, so the heart rate and the myoelectric potential can be detected in real time with accuracy, and sensing of body odor or body fluids such as sweat and tears can possibly be performed in real time. Health condition, mood, and the like can possibly be known from these data.

In this manner, the graphene transistor according to the fourth embodiment, in which the top-gate electrode 15 is disposed on the surface of the substrate 1, can be integrated and mounted easily. The graphene transistor also has advantages when the substrate 1 is a highly doped silicon substrate. For example, it can be used as a dual-gate transistor of the top-gate electrode 15 and the substrate 1.

Fifth Embodiment

The present embodiment is an example in which the graphene transistor includes a liquid provided on the surface of the channel opposite from the insulating film, and a gate electrode provided in the liquid. In the following description, description of the same configurations as the embodiments described above will be omitted.

Figure 6A:
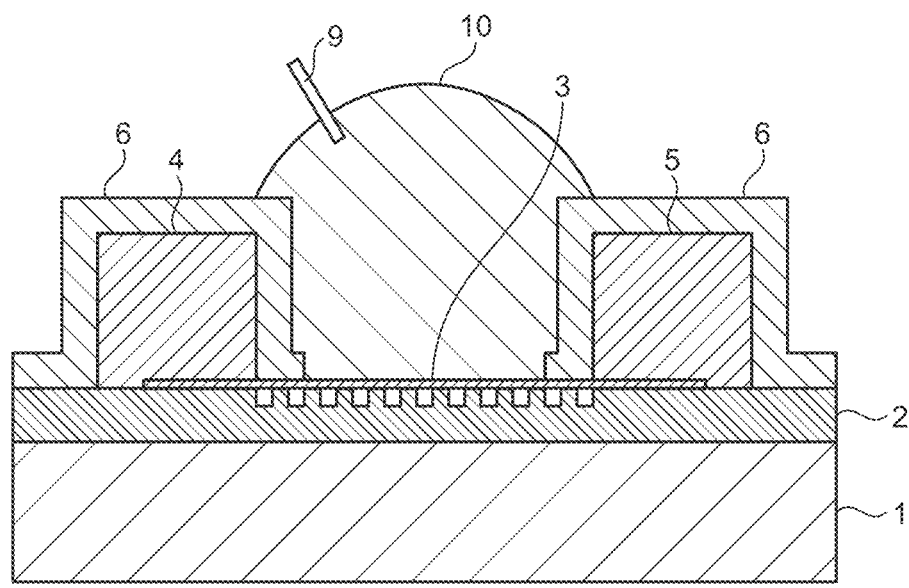
FIG. 6A is a sectional view of an example of a graphene transistor according to a fifth embodiment.

FIG. 6A is a sectional view of an example of a graphene transistor according to a fifth embodiment. As illustrated in FIG. 6A, the graphene transistor according to the present embodiment is a solution gate graphene transistor on an insulating film of a porous body, including the substrate 1, the insulating film 2 of a porous body, the channel 3, the source electrode 4, the drain electrode 5, the insulating film 6, a gate electrode 9, and a liquid 10. The insulating film 2 and the channel 3 are in contact only at bumps of the insulating film 2 and are not in contact at dips of the insulating film 2. The liquid 10 is an example of the liquid provided on the surface of the channel 3 opposite from the insulating film 2. The gate electrode 9 (an example of a third gate electrode) is connected to the liquid 10.

When a voltage is applied to the gate electrode 9, the graphene transistor according to the present embodiment forms an electric double layer in the vicinity of the gate electrode 9 in the liquid 10 and in the vicinity of the channel 3 and induces carriers in the channel 3. Since the thickness of the electric double layer is about several nm, a high electric field can be applied to the channel 3 at a low voltage.

The gate electrode 9 is preferably a silver-silver chloride electrode (Ag/AgCl), a calomel electrode, a palladium-hydrogen electrode (Pd/H2), or the like having excellent stability and reproducibility of the electrode potential in the liquid 10. The liquid 10 may be any liquid as long as it can form an electric double layer and is preferably a phosphate-buffered saline (PBS) or the like capable of keeping the pH constant so as to ensure the characteristic stability of the transistor.

The graphene transistor according to the present embodiment can also be used as a dual-gate transistor of the gate electrode 9 and the substrate 1 when the substrate 1 is, for example, a highly doped silicon substrate.

Figure 6B:
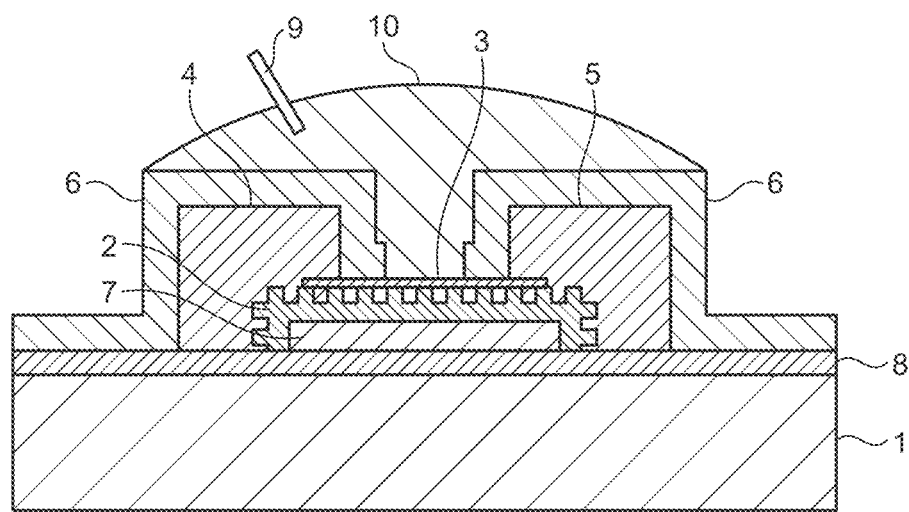
FIG. 6B is a sectional view of another example of the graphene transistor according to the fifth embodiment.

FIG. 6B is a sectional view of another example of the graphene transistor according to the fifth embodiment. The graphene transistor according to the present embodiment includes the substrate 1, the insulating film 8, the gate electrode 7, the insulating film 2, the channel 3, the source electrode 4, the drain electrode 5, the gate electrode 9, and the liquid 10 as illustrated in FIG. 6B. The insulating film 2 and the channel 3 are in contact only at bumps of the insulating film 2 and are not in contact at dips of the insulating film 2.

The graphene transistor illustrated in FIG. 6B, in which a bottom gate (the substrate 1 of graphene transistor illustrated in FIG. 6A or the gate electrode 7 of the graphene transistor illustrated in FIG. 6B) is disposed on the surface of the substrate 1, can be integrated and mounted easily as compared with the case where use as the dual-gate transistor illustrated in FIG. 6A. Further, the graphene transistor has advantages when a plurality of graphene transistors are arrayed. For example, it is possible to apply individual gate voltages to individual elements.

Figure 6C:
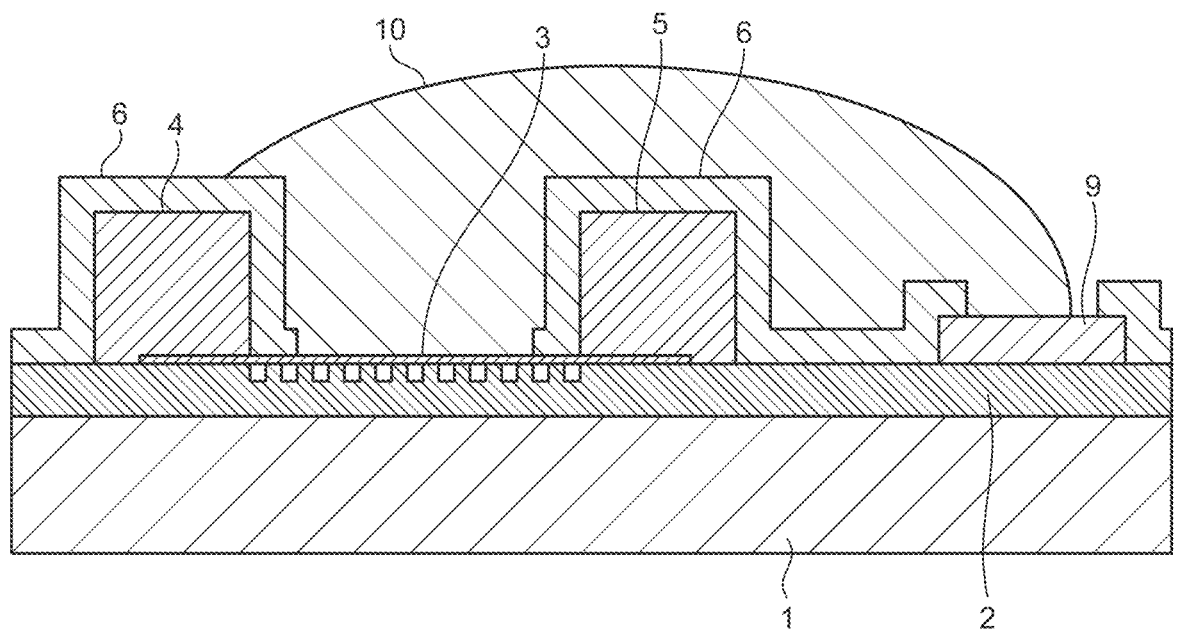
FIG. 6C is a sectional view of an example of the graphene transistor according to the fifth embodiment.
Figure 6D:
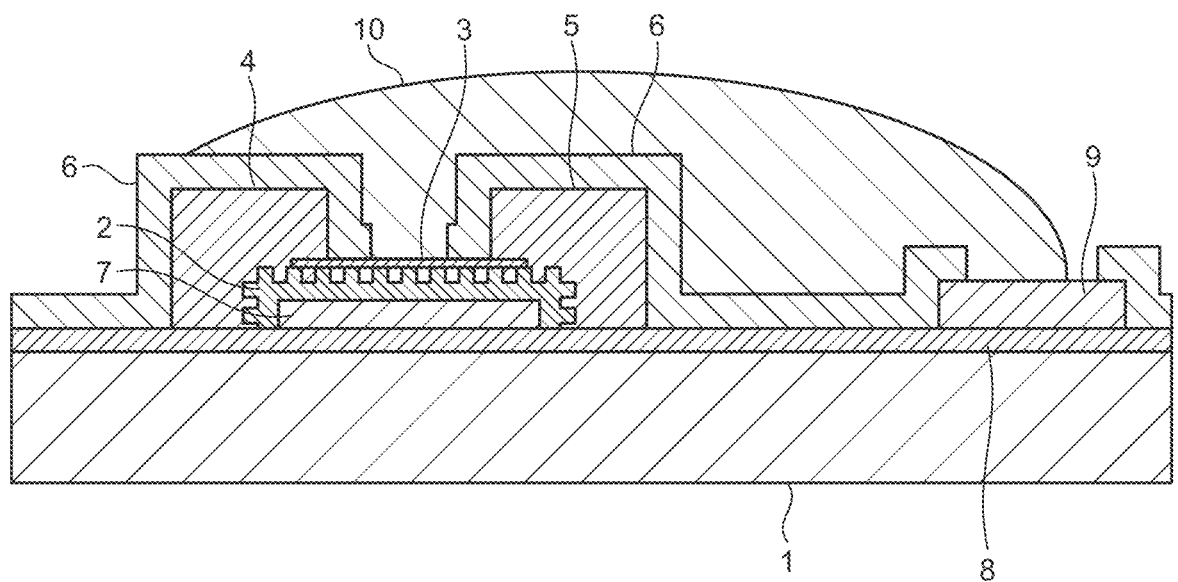
FIG. 6D is a sectional view of an example of the graphene transistor according to the fifth embodiment.

FIGS. 6C and 6D are sectional views of an example of the graphene transistor according to the fifth embodiment. In the graphene transistor illustrated in FIGS. 6A and 6B, the gate electrode 9 has a rod shape. However, the gate electrode 9 may be formed on the insulating film 2 or on the insulating film 8 as illustrated in FIGS. 6C and 6D as long as the gate electrode 9 is connected to the channel 3 via the liquid 10.

In the insulating film 2 illustrated in FIGS. 6A to 6D, the entire surface of the substrate 1 may be a porous body, and pores may penetrate to the substrate 1 or the gate electrode 7 as long as a region under the channel 3 between the source electrode 4 and the drain electrode 5 is porous as in FIGS. 2A to 2E.

In the graphene transistor illustrated in FIGS. 6B and 6D, the substrate 1 and the insulating film 8 may be integrated as a substrate having an insulating property, and may be, for example, a substrate having flexibility such as polyimide, PEN, or PET. When the graphene transistor is formed on a substrate having flexibility, a sensor or the like to which the graphene transistor is applied can be formed on a curved surface, and for example, a sensor or the like to attach to a human body can be realized, which is very useful for sensing vital data. The sensor and the body can closely contact each other, so the heart rate and the myoelectric potential can be detected in real time with accuracy, and sensing of body odor or body fluids such as sweat and tears can possibly be performed in real time. Health condition, mood, and the like can possibly be known from these data.

In this manner, the graphene transistor according to the fifth embodiment can be used as an electric double layer solution gate transistor capable of applying a high electric field at a low voltage.

Sixth Embodiment

The present embodiment is an example in which the graphene transistor includes a receptive layer on the surface of the channel opposite from the insulating film. In the following description, description of the same configurations as the embodiments described above will be omitted.

Figure 7A:
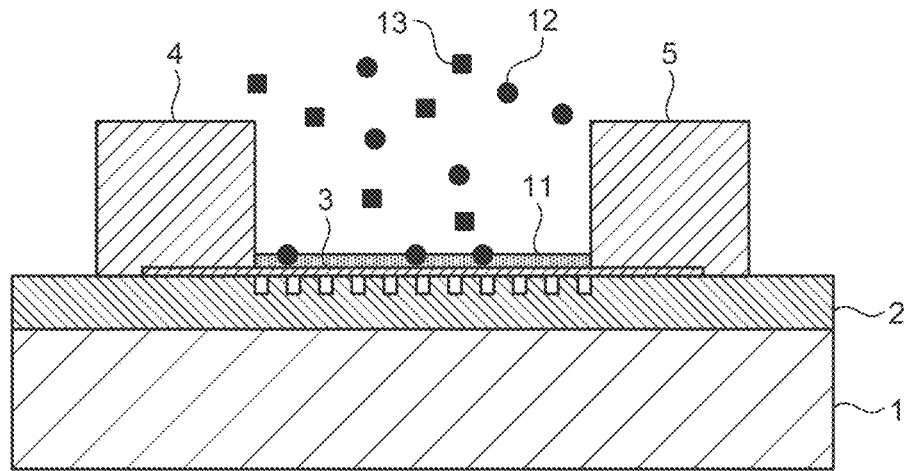
FIG. 7A is a sectional view of an example of a graphene transistor according to a sixth embodiment.

FIG. 7A is a sectional view of an example of a graphene transistor according to a sixth embodiment. As illustrated in FIG. 7A, the graphene transistor according to the present embodiment is a graphene transistor capable of functioning as a gas sensor, the graphene transistor including a receptive layer 11 (an example of a receptive part) on the channel 3 of the graphene transistor illustrated in FIG. 2A. The receptive layer 11 traps only a target substance 12 and does not react with substances 13 other than the target substance 12. The graphene transistor according to the present embodiment can electrically sense the presence or absence and concentration of the target substance 12 by changing the current Ids flowing between the source electrode 4 and the drain electrode 5 when the receptive layer 11 traps the target substance 12.

The receptive layer 11 is appropriately selected according to the target substance 12. For example, when the target substance 12 is hydrogen (H$_2$), the receptive layer 11 may be a palladium (Pd) film or the like. When the target substance 12 is oxygen (O$_2$), the receptive layer 11 may be a titanium oxide (TiO$_2$) film. When the target substance 12 is nitrogen dioxide (NO$_2$), the receptive layer 11 may be a zinc oxide (ZnO) film, a tin oxide (SnO$_2$) film, or the like. When the target substance 12 is ammonia (NH$_3$), the receptive layer 11 may be a cuprous bromide (CuBr) film or the like.

Figure 7B:
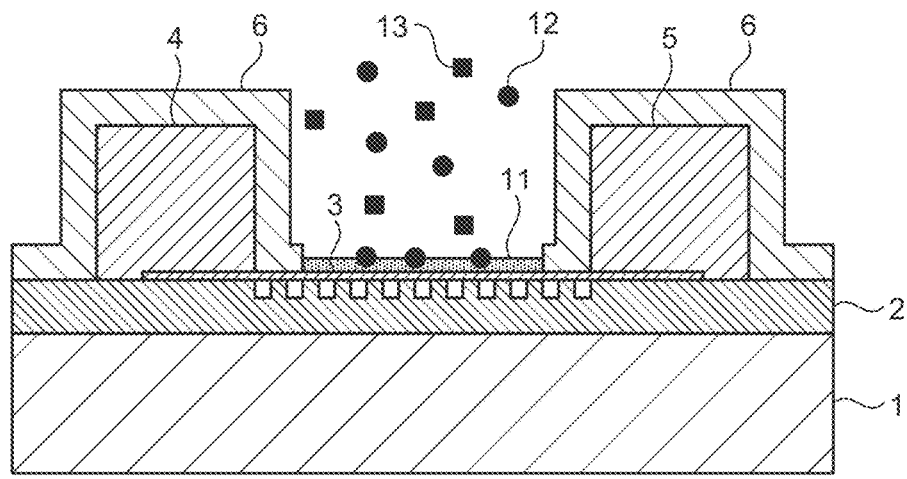
FIG. 7B is a sectional view of another example of the graphene transistor according to the sixth embodiment.

FIG. 7B is a sectional view of another example of the graphene transistor according to the sixth embodiment. As illustrated in FIG. 7B, the graphene transistor according to the present embodiment is different from the graphene transistor illustrated in FIG. 7A in that the source electrode 4 and the drain electrode 5 are covered with the insulating film 6, but it has the same function as the graphene transistor illustrated in FIG. 7A. The graphene transistor illustrated in FIG. 7B, in which the source electrode 4 and the drain electrode 5 are not connected by the receptive layer 11, can eliminate the influence of the current flowing through the receptive layer 11 itself that becomes noise at the time of sensing.

Figure 7C:
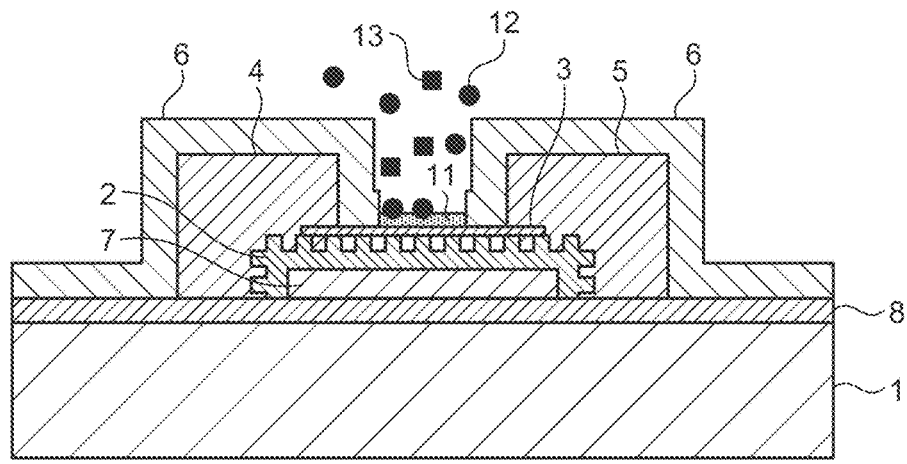
FIG. 7C is a sectional view of another example of the graphene transistor according to the sixth embodiment.

FIG. 7C is a sectional view of another example of the graphene transistor according to the sixth embodiment. The graphene transistor according to the present embodiment includes the substrate 1, the insulating film 8, the gate electrode 7, the insulating film 2, the channel 3, the source electrode 4, the drain electrode 5, the insulating film 6, and the receptive layer 11 as illustrated in FIG. 7C. The insulating film 2 and the channel 3 are in contact only at bumps of the insulating film 2 and are not in contact at dips of the insulating film 2.

The graphene transistor illustrated in FIG. 7C, in which the gate electrode 7 is disposed on the surface of the substrate 1, can be integrated and mounted easily, and the graphene transistor has advantages when a plurality of graphene transistors are arrayed. For example, it is possible to apply individual gate voltages to individual elements. For example, according to the graphene transistor illustrated in FIG. 7C, a sensor array can be formed, and the receptive layer 11 is formed in each sensor (graphene transistor). The receptive layer 11 may be different for each sensor. With this configuration, as many target substances 12 can be detected as the number of sensor types.

In the insulating film 2 illustrated in FIGS. 7A to 7C, the entire surface of the substrate 1 may be a porous body, and the pores of the porous body may penetrate to the substrate 1 or the gate electrode 7 as long as there is a porous body under the region of the channel 3 between the source electrode 4 and the drain electrode 5 as in the graphene transistor illustrated in FIG. 2A.

In the graphene transistor illustrated in FIG. 7C, the substrate 1 and the insulating film 8 may be integrated as a substrate having an insulating property, and may be, for example, a substrate having flexibility such as polyimide, PEN, or PET. A sensor or the like to which the graphene transistor is applied can be formed on a curved surface by forming the graphene transistor on a substrate having flexibility, and for example, a sensor or the like to attach to a human body can be realized, which is very useful for sensing vital data. The sensor and the body can closely contact each other, so the heart rate and the myoelectric potential can be detected in real time with accuracy, and sensing of body odor or body fluids such as sweat and tears can possibly be performed in real time. Health condition, mood, and the like can possibly be known from these data.

In this manner, the graphene transistor according to the sixth embodiment, in which the current Ids flowing between the source electrode 4 and the drain electrode 5 changes when the receptive layer 11 traps the target substance 12, can electrically sense the presence or absence and concentration of the target substance 12.

Seventh Embodiment

The present embodiment is an example in which the graphene transistor includes a liquid on the surface of the receptive layer opposite from the channel. In the following description, description of the same configurations as the embodiments described above will be omitted.

Figure 8A:
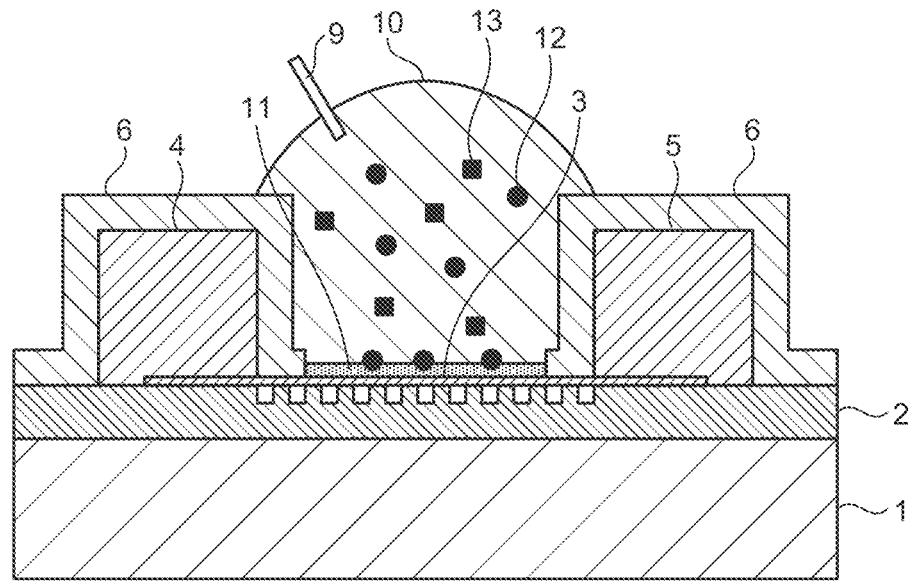
FIG. 8A is a sectional view of an example of a graphene transistor according to a seventh embodiment.

FIG. 8A is a sectional view of an example of a graphene transistor according to a seventh embodiment. As illustrated in FIG. 8A, the graphene transistor according to the present embodiment is a graphene transistor capable of functioning as a solution sensor, the graphene transistor including the receptive layer 11 on the channel 3 of the solution gate graphene transistor illustrated in FIG. 6A. The graphene transistor according to the present embodiment has the liquid 10 on the surface of the receptive layer 11 opposite from the channel 3 as illustrated in FIG. 8A. The receptive layer 11 does not react with substances 13 other than the sensing target substance 12. The graphene transistor according to the present embodiment, in which the current Ids flowing between the source electrode 4 and the drain electrode 5 changes when the receptive layer 11 traps the target substance 12, can electrically sense the presence or absence and concentration of the target substance 12. That is, the graphene transistor according to the present embodiment can be applied to a biosensor that detects a target substance based on a change in electric charge of the channel 3 according to the presence or absence and concentration of the target substance (an example of a predetermined substance).

The receptive layer 11 is appropriately selected according to the target substance 12. For example, when the target substance 12 is a molecule, the receptive layer 11 is preferably a molecularly imprinted polymer corresponding to the molecule. When the target substance 12 is an ion, the receptive layer 11 is preferably an ionophore corresponding to the ion. When the target substance 12 is an antigen such as a hormone, the receptive layer 11 is preferably an antibody corresponding to the antigen. When the target substance 12 is a nucleic acid molecule, the receptive layer 11 is preferably a nucleic acid (DNA, RNA) aptamer corresponding to the nucleic acid molecule. When the target substance 12 is an amino acid, a protein, or the like, the receptive layer 11 is preferably a peptide, an aptamer, or the like corresponding to the amino acid, the protein, or the like.

The graphene transistor illustrated in FIG. 8A can also be used as a dual-gate transistor of the gate electrode 9 and the substrate 1 when the substrate 1 is, for example, a highly doped silicon substrate.

Figure 8B:
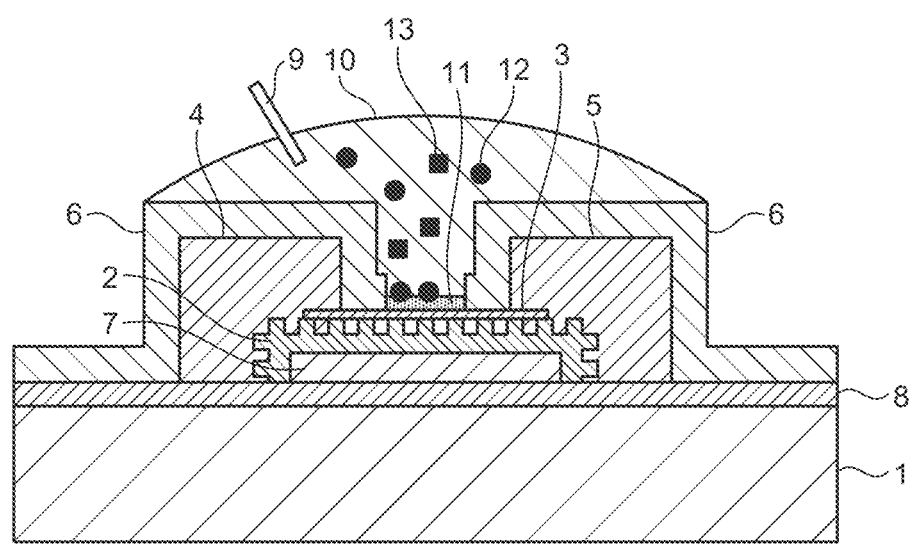
FIG. 8B is a sectional view of another example of the graphene transistor according to the seventh embodiment.

FIG. 8B is a sectional view of another example of the graphene transistor according to the seventh embodiment. The graphene transistor according to the present embodiment includes the substrate 1, the insulating film 8, the gate electrode 7, the insulating film 2, the channel 3, the source electrode 4, the drain electrode 5, the insulating film 6, and the receptive layer 11 as illustrated in FIG. 8B. The insulating film 2 and the channel 3 are in contact only at bumps of the insulating film 2 and are not in contact at dips of the insulating film 2.

The graphene transistor illustrated in FIG. 8B, in which a bottom gate (the substrate 1 of the graphene transistor illustrated in FIG. 8A or the gate electrode 7 of the graphene transistor illustrated in FIG. 8B) can be disposed on the surface of the substrate 1, can be integrated and mounted easily as compared with the case where the graphene transistor illustrated in FIG. 8A is used as a dual-gate transistor. Further, the graphene transistor has advantages when a plurality of graphene transistors are arrayed. For example, it is possible to apply individual gate voltages to individual elements.

Figure 8C:
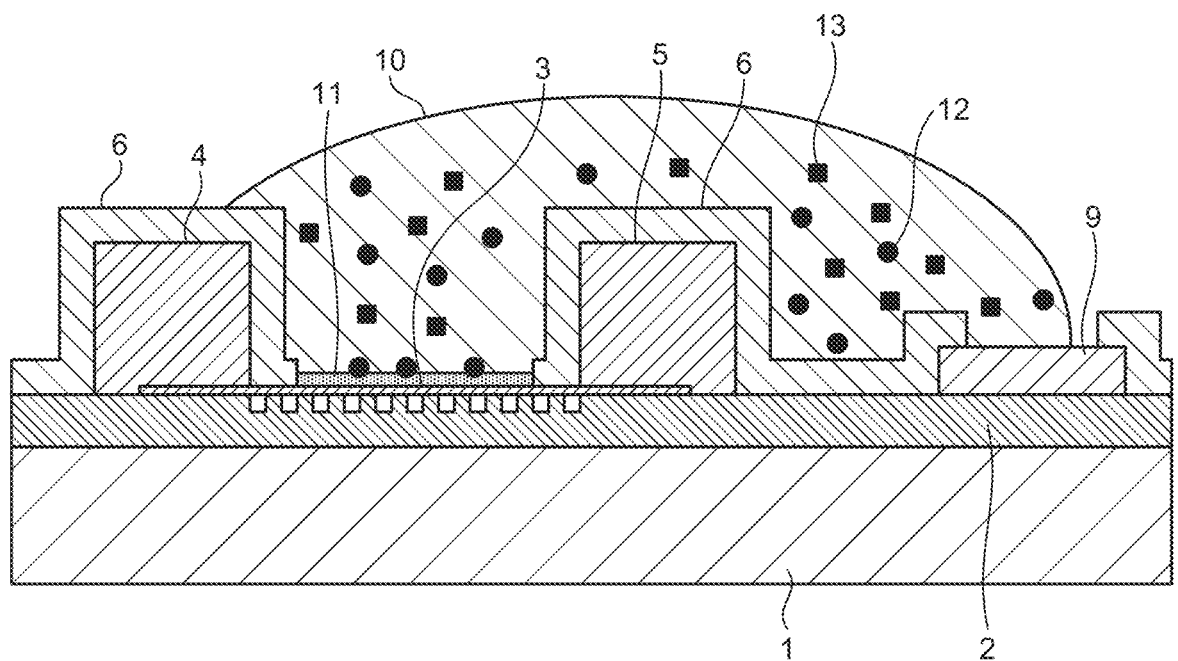
FIG. 8C is a sectional view of another example of the graphene transistor according to the seventh embodiment.
Figure 8D:
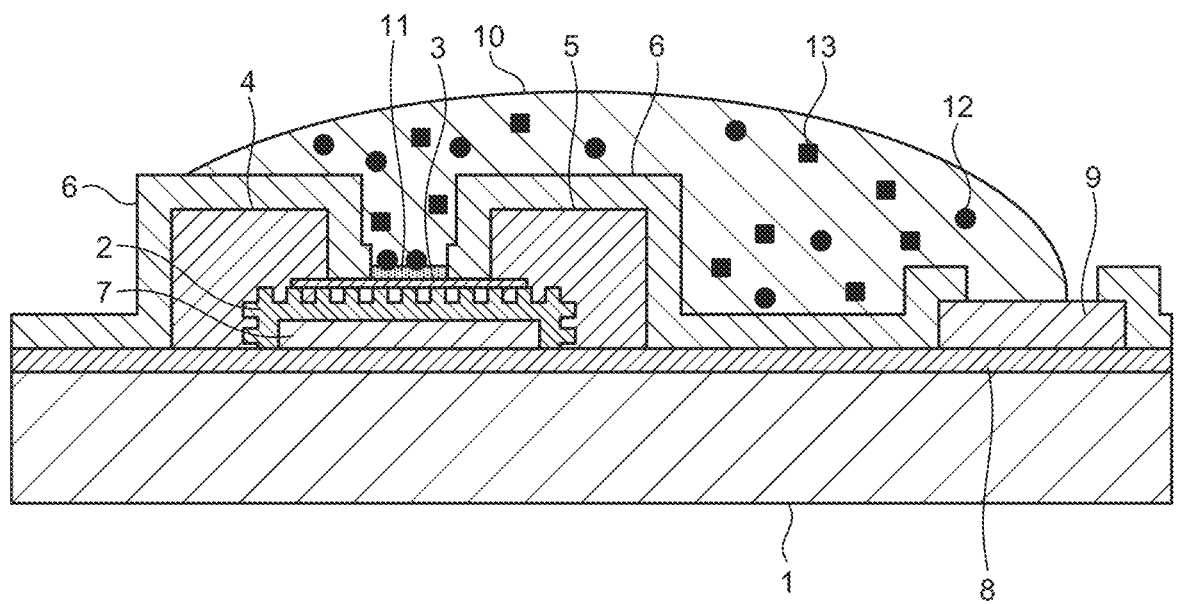
FIG. 8D is a sectional view of another example of the graphene transistor according to the seventh embodiment.

FIGS. 8C and 8D are sectional views of another example of the graphene transistor according to the seventh embodiment. An example in which the gate electrode 9 has a rod shape is illustrated in the graphene transistors illustrated in FIGS. 8A and 8B, but the gate electrode 9 may be formed on the insulating film 2 or on the insulating film 8 as illustrated in FIGS. 8C and 8D as long as the gate electrode 9 is connected to the channel 3 via the liquid 10.

Figure 8E:
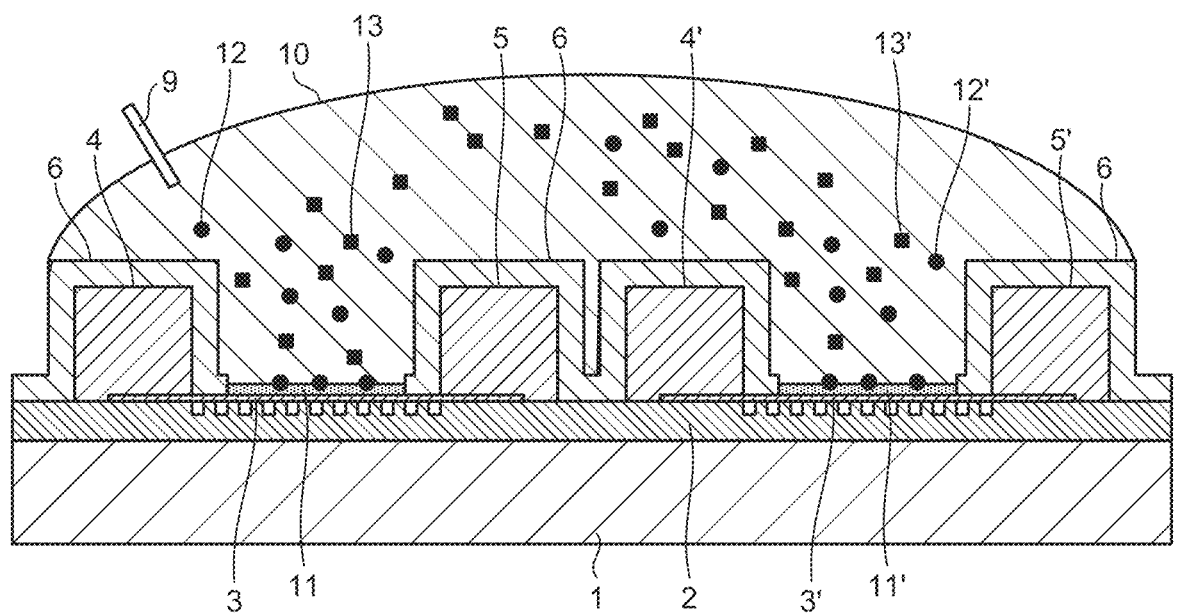
FIG. 8E is a sectional view of a solution sensor array using the graphene transistor according to the seventh embodiment.
Figure 8F:
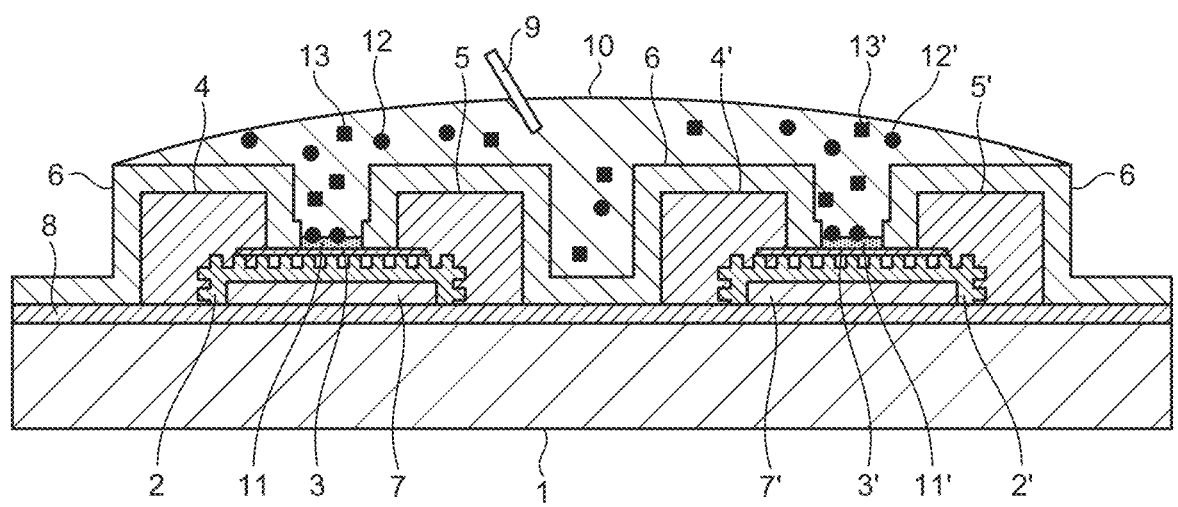
FIG. 8F is a sectional view of a solution sensor array using the graphene transistor according to the seventh embodiment.
Figure 8G:
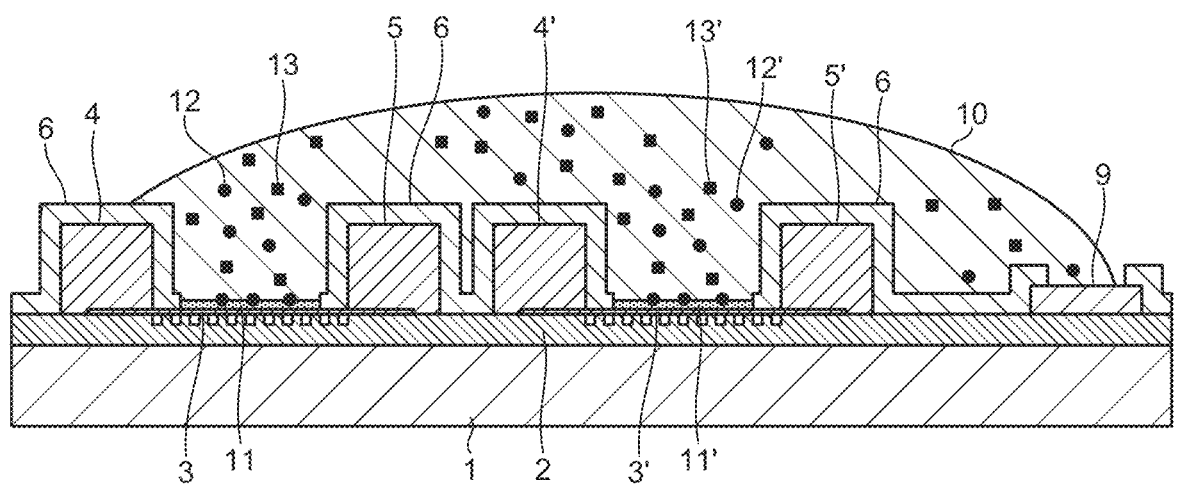
FIG. 8G is a sectional view of a solution sensor array using the graphene transistor according to the seventh embodiment.
Figure 8H:
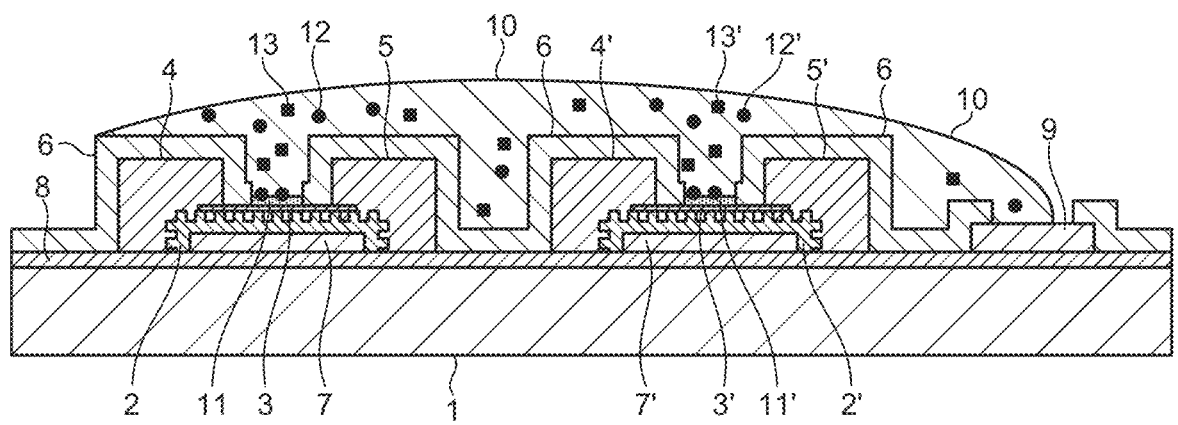
FIG. 8H is a sectional view of a solution sensor array using the graphene transistor according to the seventh embodiment.

FIGS. 8E to 8H are sectional views of solution sensor arrays using the graphene transistor according to the seventh embodiment. Specifically, the solution sensor array illustrated in FIG. 8E is a solution sensor array having two graphene transistors each illustrated in FIG. 8A. The solution sensor array illustrated in FIG. 8F is a solution sensor array having two graphene transistors each illustrated in FIG. 8B. The solution sensor array illustrated in FIG. 8G is a solution sensor array having two graphene transistors each illustrated in FIG. 8C. The solution sensor array illustrated in FIG. 8H is a solution sensor array having two graphene transistors each illustrated in FIG. 8D.

The solution sensor arrays illustrated in FIGS. 8F and 8H can apply different gate voltages to the gate electrode 7 and the gate electrode 7', can induce any carriers individually in the channel 3 and the channel 3', and can control the reference voltages (Dirac voltages). Since the solution sensor arrays can control individual reference voltages (Dirac voltages), they can reduce and control variations in characteristics between the sensors of the graphene transistor array and can perform measurement with accuracy.

Figure 8I:
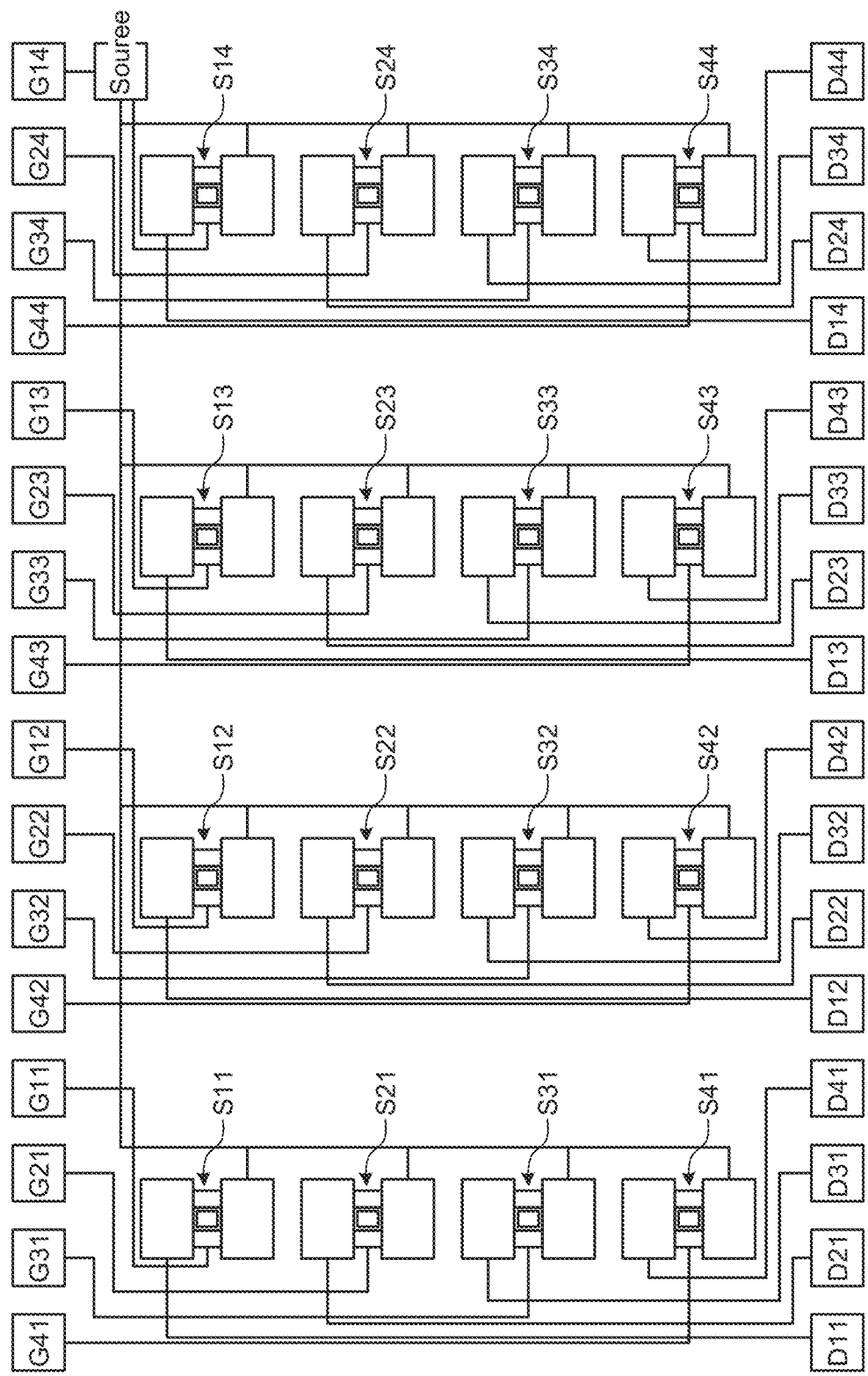
FIG. 8I is a diagram illustrating an example of a 4×4 array of sensors using the graphene transistor according to the seventh embodiment.

FIG. 8I is a diagram illustrating an example of a 4×4 array of sensors using the graphene transistor according to the seventh embodiment. Specifically, the 4×4 array illustrated in FIG. 8I is an example of a biosensor array obtained by combining a plurality of graphene transistors illustrated in FIG. 8B, in which each of the sensors S11 to S44 has the structure of the graphene transistor illustrated in FIG. 8B. The source is common to all the sensors S11 to S44 and has a configuration in which a gate voltage and a drain voltage can be applied to each graphene transistor. For example, the gate voltage of the transistor S11 is G11, and the drain voltage of the transistor S11 is applied from D11.

It is also possible to form the receptive layer 11 (region where the insulating film 6 on the channel 3 is not present), the liquid 10 containing a substance 12 other than the target substance and the target substance 13, and the gate electrode 9 on the configuration of the 4×4 array illustrated in FIG. 8I.

For example, when sensing is performed on a hormone balance in saliva with the 4×4 array illustrated in FIG. 8I, a plurality of hormones such as estrone, estradiol, estriol, progesterone, testosterone, dihydrotestosterone (DHT), androstenedione, androsterone, and cortisol can be sensed at once. According to the 4×4 array illustrated in FIG. 8I, not only the absolute amount of each of the plurality of hormones can be known, but also the balance of hormones when the hormones in a single sample are compared can be grasped.

Figure 8J:
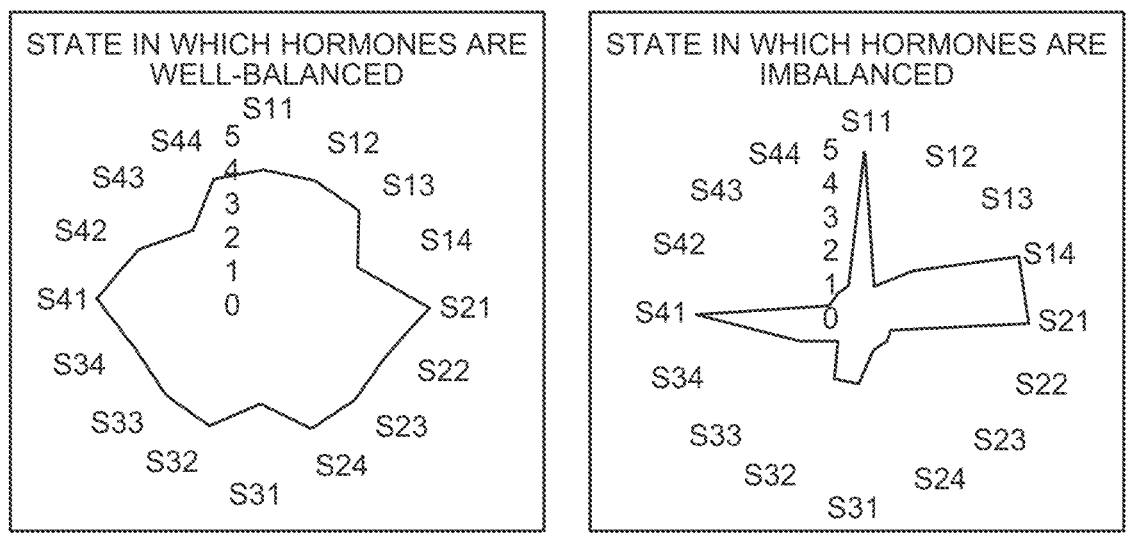
FIG. 8J is a diagram illustrating an example of hormone sensing results with a sensor using the graphene transistor according to the seventh embodiment.

FIG. 8J is a diagram illustrating an example of hormone sensing results with a sensor using the graphene transistor according to the seventh embodiment. By devising the positions of the sensors S11 to S44 in the 4×4 array, it is also possible to visualize hormone imbalance and the like as illustrated in FIG. 8J.

In the insulating film 2 of the graphene transistor illustrated in FIGS. 8A to 8I, the entire surface of the substrate 1 may be a porous body, and pores of the porous body may penetrate to the substrate 1 or the gate electrode 7, as long as there is a porous body under the region of the channel 3 between the source electrode 4 and the drain electrode 5 as in FIG. 2A.

In FIGS. 8B, 8D, 8F, and 8H, the substrate 1 and the insulating film 8 may be integrated as a substrate having an insulating property, and may be, for example, a substrate having flexibility such as polyimide, PEN, or PET. A sensor or the like to which the graphene transistor is applied can be formed on a curved surface by forming the graphene transistor on a substrate having flexibility, and for example, a sensor or the like to attach to a human body can be realized, which is very useful for sensing vital data. The sensor and the body can closely contact each other, so the heart rate and the myoelectric potential can be detected in real time with accuracy. In addition, sensing of body odor or body fluids such as sweat and tears can possibly be performed in real time, and health condition, mood, and the like can possibly be known from these data.

In this manner, the graphene transistor according to the seventh embodiment, in which the current Ids flowing between the source electrode 4 and the drain electrode 5 changes when the receptive layer 11 traps the target substance 12, can electrically sense the presence or absence and concentration of the target substance 12.

An embodiment can reduce the influence from a base substrate to an atomic layered material and can form the atomic layered material with a high yield rate.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

What is claimed is:

1. A semiconductor device comprising:
a first gate electrode;
an insulating film on the first gate electrode;
a source electrode connected to the insulating film;
a drain electrode connected to the insulating film; and
a contact part between the source electrode and the drain electrode and on the insulating film, the contact part containing an atomic layered material, wherein
the contact part has a second surface contactable with a sample, the second surface being opposite to a first surface of the contact part facing the insulating film,
a surface of the insulating film that faces the contact part has an uneven structure,
the insulating film is between the contact part and the first gate electrode,
the uneven structure of the insulating film is in contact with the first surface of the contact part, the insulating film covers an upper surface and a side surface of the first gate electrode, and the insulating film further includes the uneven structure on a portion that covers the side surface of the first gate electrode.

2. The semiconductor device according to claim 1, wherein the atomic layered material contains graphene.

3. The semiconductor device according to claim 1, wherein the insulating film is a porous body.

4. The semiconductor device according to claim 1, further comprising:
a substrate; and
a second insulating film between the substrate and the first gate electrode.

5. The semiconductor device according to claim 1, further comprising:
a second gate electrode; and
a third insulating film between the second gate electrode and the second surface.

6. The semiconductor device according to claim 1, further comprising:
a liquid on the second surface; and
a third gate electrode connected to the liquid.

7. The semiconductor device according to claim 1, further comprising a receptive part on the second surface.

8. A biosensor comprising the semiconductor device according to claim 7,
the biosensor being configured to detect a predetermined substance based on a change in electric charge of the contact part according to a concentration of the predetermined substance.

9. A biosensor array comprising the semiconductor device according to claim 7, the biosensor array including a plurality of semiconductor devices.

10. A logic circuit comprising the semiconductor device according to claim 1, the logic circuit including a plurality of semiconductor devices.

11. The semiconductor device according to claim 1, wherein the portion of the insulating film that further includes the uneven structure on the portion that covers the side surface of the first gate electrode is covered by the source electrode and the drain electrode.

* * * * *